(12) United States Patent  (10) Patent No.: US 7,218,349 B2
Kimura  (45) Date of Patent: May 15, 2007

(54) SEMICONDUCTOR DEVICE

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 798 days.

(21) Appl. No.: 10/216,551

(22) Filed: Aug. 8, 2002

(65) Prior Publication Data

US 2003/0052324 A1  Mar. 20, 2003

(30) Foreign Application Priority Data

Aug. 9, 2001  (JP)  ............................. 2001-243044

(51) Int. Cl.
  *H04N 3/14*  (2006.01)
(52) U.S. Cl. ....................... 348/301; 348/294
(58) Field of Classification Search ..................... None
  See application file for complete search history.

(56) References Cited

U.S. PATENT DOCUMENTS

| | | | |
|---|---|---|---|
| 3,506,851 A | 4/1970 | Polkinghorn et al. | |
| 3,774,055 A | 11/1973 | Bapat | |
| 3,898,479 A | 8/1975 | Proebsting | |
| 4,090,096 A | 5/1978 | Nagami | |
| 4,390,803 A | 6/1983 | Koike | |
| 4,412,139 A | 10/1983 | Horninger | |
| 4,633,105 A | 12/1986 | Tsujimoto | |
| 4,804,870 A | 2/1989 | Mahmud | |
| 4,959,697 A | 9/1990 | Shier et al. | |
| 5,033,068 A * | 7/1991 | Imai .............................. | 377/60 |
| 5,216,290 A * | 6/1993 | Childers ..................... | 327/530 |
| 5,467,038 A | 11/1995 | Motely et al. | |
| 5,548,143 A | 8/1996 | Lee | |
| 5,594,380 A * | 1/1997 | Nam .......................... | 327/390 |
| 5,643,826 A | 7/1997 | Ohtani et al. | |
| 5,694,061 A | 12/1997 | Morosawa et al. | |
| 5,870,071 A | 2/1999 | Kawahata | |
| 5,889,291 A | 3/1999 | Koyama et al. | |
| 5,949,271 A | 9/1999 | Fujikura | |
| 5,952,991 A | 9/1999 | Akiyama | |

(Continued)

FOREIGN PATENT DOCUMENTS

EP  1063630 A2  12/2000

(Continued)

OTHER PUBLICATIONS

Search Report (Singapore Application No. 200202969-2), Apr. 27, 2004, 8 pages.

(Continued)

*Primary Examiner*—David Ometz
*Assistant Examiner*—Luong T. Nguyen
(74) *Attorney, Agent, or Firm*—Fish & Richardson P.C.

(57) ABSTRACT

A semiconductor device is provided in which each pixel includes an electric circuit (a bootstrap circuit) for generating an electric potential that is higher than a voltage given through capacitative coupling. Also, there is provided a semiconductor device in which a sufficient signal amplitude can be attained by using the electric circuit to set a potential difference between both terminals of a photoelectric conversion element to the same value as the power source potential. Further, there is provided a semiconductor device in which the number of manufacturing steps is reduced by using transistors having a single polarity to constitute each pixel, thereby achieving increased yield and reduced costs.

41 Claims, 14 Drawing Sheets

U.S. PATENT DOCUMENTS

| | | |
|---|---|---|
| 6,040,810 A | 3/2000 | Nishimura |
| 6,049,228 A | 4/2000 | Moon |
| 6,091,393 A | 7/2000 | Park |
| 6,384,804 B1 | 5/2002 | Dodabalapur et al. |
| 6,501,098 B2 | 12/2002 | Yamazaki |
| 6,522,323 B1 | 2/2003 | Sasaki et al. |
| 6,542,138 B1 | 4/2003 | Shannon et al. |
| 6,686,899 B2 | 2/2004 | Miyazawa et al. |
| 6,788,108 B2 * | 9/2004 | Miyake et al. ............... 326/88 |
| 6,813,332 B2 | 11/2004 | Nagao et al. |
| 2001/0002703 A1 | 6/2001 | Koyama |
| 2001/0045565 A1 | 11/2001 | Yamazaki |
| 2002/0011973 A1 | 1/2002 | Komiya |
| 2002/0044208 A1 | 4/2002 | Yamazaki et al. |
| 2002/0097212 A1 | 7/2002 | Miyazawa et al. |
| 2002/0158666 A1 | 10/2002 | Azami et al. |
| 2002/0167026 A1 | 11/2002 | Azami et al. |
| 2002/0190326 A1 | 12/2002 | Nagao et al. |
| 2003/0011584 A1 | 1/2003 | Azami et al. |
| 2003/0020520 A1 | 1/2003 | Miyake et al. |
| 2003/0034806 A1 | 2/2003 | Azami et al. |
| 2003/0111677 A1 | 6/2003 | Miyake et al. |

FOREIGN PATENT DOCUMENTS

| | | |
|---|---|---|
| EP | 1 139 326 | 10/2001 |
| JP | 55-156427 | 12/1980 |
| JP | 59-016424 | 1/1984 |
| JP | 59-16424 | 1/1984 |
| JP | 60-140924 | 7/1985 |
| JP | 03-165171 | 7/1991 |
| JP | 06-098081 | 4/1994 |
| JP | 09-186312 | 7/1997 |
| JP | 9-246936 | 9/1997 |
| JP | 63-204815 | 8/1998 |
| JP | 2000/106617 | 4/2000 |
| JP | 2001-005426 | 1/2001 |
| JP | 2001/109394 | 4/2001 |
| JP | 2001-133431 | 5/2001 |
| JP | 2001-202035 | 7/2001 |
| JP | 2002-176162 | 6/2002 |
| JP | 2002/251164 | 9/2002 |
| WO | WO 99/53687 | * 10/1999 |

OTHER PUBLICATIONS

Munehiro Azami et al.; U.S. Appl. No. 10/127,600; Office Action dated Oct. 22, 2004.

US 6,646,476, 11/2003, Nagao et al. (withdrawn)

* cited by examiner

DRIVER CIRCUIT PORTION → PIXEL PORTION

SEMICONDUCTOR DEVICE

BACKGROUND OF THE INVENTION

1. Field of the Invention

The present invention relates to a semiconductor device having an image sensor function.

2. Description of the Related Art

A semiconductor device having an image sensor function is generally provided with a photoelectric conversion element and one or plural transistors for controlling the photoelectric conversion element.

There are roughly two types of semiconductor devices having an image sensor function: CCD type semiconductor devices and CMOS type semiconductor devices. The CMOS type semiconductor devices are subdivided into those of a passive type with no amplification circuit mounted therein and those of an active type with an amplification circuit mounted therein. An amplification circuit has a function of amplifying an image signal of a subject read by a photoelectric conversion element, making the obtained signal less susceptible to an influence of noise. Accordingly, active CMOS type semiconductor devices provided with amplification circuits find utility in a wide variety of electronic appliances.

A semiconductor device provided with photoelectric conversion elements has a pixel portion as well as a source signal line driver circuit, a gate signal line driver circuit, and a reset signal line driver circuit which are arranged in the periphery of the pixel portion. The source signal line driver circuit includes a bias circuit, a sample hold circuit, a signal output line driver circuit, and a final output amplification circuit. The pixel portion is constituted by x times y pixels arranged in matrix (x and y are natural numbers).

FIG. 11A is a circuit diagram of one pixel 100 arranged in j-th column and j-th row (i and j are natural numbers) of the matrix arrangement. The pixel 100 is arranged within an area defined by one of signal output lines ($S_1$ to Sx), one of power source supply lines ($VB_1$ to VBx), one of gate signal lines ($G_1$ to Gy), and one of reset signal lines ($R_1$ to Ry). The pixel 100 includes an n-channel switching transistor 1120, an n-channel amplification transistor 1130, a p-channel reset transistor 1140, and a photoelectric conversion element 1110. A p-channel-side terminal of the photoelectric conversion element 1110 is connected to a power source reference line 1210.

An explanation of circuit operations is often accompanied by an explanation of transistor operations. An ON-state of a transistor refers to a state where the absolute value of a voltage between the gate and the source of the transistor exceeds that of a threshold voltage for the transistor so that an electrical conduction is established between source and drain regions of the transistor through a channel formation region. On the other hand, an OFF-state of a transistor refers to a state where the absolute value of a voltage between the gate and the source of the transistor is below that of a threshold voltage for the transistor so that no electrical conduction is provided between the source and drain regions of the transistor.

Upon being irradiated with light that is reflected from a subject, the photoelectric conversion element 1110 included in the pixel 100 undergoes a change in its electric potential. More specifically, a potential of an n-channel-side terminal of the photoelectric conversion element 1110 changes. Selecting the gate signal line (Gj) in this state causes the switching transistor 1120 to turn on, whereby the potential of t the n-channel-side terminal of the photoelectric conversion element 1110 is read out in the form of a signal. The signal thus outputted to the signal output line (Sj) is then supplied to the source signal line driver circuit 101.

The term storage time as used herein refers to a period of time from when a photoelectric conversion element arranged in a pixel is initialized until a signal is outputted from the pixel. In other words, it is a period of time during which light is irradiated onto a light receiving portion of the photoelectric conversion element to thereby store the signal to be outputted, and as such it corresponds to a period of time also referred to as exposure time. In addition, the term saturation refers to a state where a potential of the n-channel-side terminal of the photoelectric conversion element 1110 has fallen upon irradiation of extremely bright light and has become equal to a potential of the power source reference line 1210 with no further changes in its value.

An amplitude of a signal inputted to each n-channel transistor is set to $V_{dd}$ (Hi, H level)–$V_{ss}$ (Lo, L level) regardless of whether the signal is outputted from the reset signal line or the gate signal line. Also, an amplitude of a signal inputted to each p-channel transistor is set to $V_{ss}$ (Hi, H level)–$V_{dd}$ (Lo, L level) regardless of whether the signal is outputted from the reset signal line or the gate signal line. In the initial state, the respective potentials of the source signal line (Si), the gate signal line (Gj), the reset signal line (Rj), and the power source reference line 1210 are all set to $V_{ss}$, whereas the potential of the power source supply line (VBi) is set to $V_{dd}$.

Next, brief description will be made of connection arrangements for the p-channel reset transistor 1140 as well as how it operates. The source region of the reset transistor 1140 in FIG. 11A is connected to the power source supply line (VBi) and the drain region thereof is connected to the n-channel-side terminal of the photoelectric conversion element 1110. Also, the gate electrode of the reset transistor 1140 is connected to the reset signal line (Rj). Further, in the pixel 100 shown in FIG. 11A, the p-channel-side terminal of the photoelectric conversion element 1110 is connected to the power source line 1210 and the n-channel-side terminal thereof is connected to the source region of the reset transistor 1140.

When the reset signal line (Rj) in the j-th row is selected, a signal of $V_{ss}$ (Hi) potential is inputted to the gate electrode of the p-channel reset transistor 1140. Then, a voltage $V_{gs}$ between the gate and the source thereof becomes zero or lower, whereby the reset transistor 1140 is turned on. At this time, the potential of the source region of the reset transistor 1140 that is connected to the power source supply line (VBi) is $V_{dd}$. Thus, a potential $V_{pd}$ between the both terminals of the photoelectric conversion element 1110 becomes equal to the potential $V_{dd}$ of the power source supply line (VBi) ($V_{pd}=V_{dd}$).

Next, description will be made of a relationship between an intensity of light irradiated onto the photoelectric conversion element 1110 and a potential of the photoelectric conversion element 1110, with reference made to FIG. 11B. Referring to FIG. 11B, a solid line indicates the potential $V_{pd}$ of the photoelectric conversion element 1110 upon irradiation of dark light, a dotted line indicates the potential $V_{pd}$ of the photoelectric conversion element 1110 upon irradiation of bright light, and a broken line indicates the potential of the reset signal line Rj.

The photoelectric conversion element 1110 stores electric charges generated by light irradiated thereto during storage time. Thus, even when lights having-the same intensity are irradiated, a total amount of charges generated by each light and hence the resulting signal value differ if the storage time is varied. As shown in FIG. 11B, when bright light is irradiated to the photoelectric conversion element 1110, a saturation state is reached with short storage time. On the other hand, when dark light is irradiated to the photoelectric conversion element 1110, longer storage time becomes necessary, but the saturation state is eventually reached nevertheless. That is, the signal to be read out from the photoelectric conversion element 1110 is determined by the product of an intensity of light irradiated thereto and a storage time.

In the pixel 100 shown in FIG. 11A, the reset transistor 1140 is a p-channel transistor and the potential difference $V_{pd}$ between both electrodes of the photoelectric conversion element 1110 has the same value as the potential $V_{dd}$ supplied though the power source supply line (VBi), thus making it possible to obtain a sufficient signal amplitude. In other words, the potential of the n-channel-side terminal of the photoelectric conversion element 1110 can be sufficiently raised up to $V_{dd}$ without causing amplitude attenuation.

Next, description will turn to a case where all the transistors included in the pixel 100 are constituted by n-channel transistors, with reference made to FIG. 12A. Note that a threshold voltage of the n-channel reset transistor 1140 is denoted by a symbol $V_{thN}$.

A brief explanation will be given with regard to an operation of the n-channel reset transistor 1140 shown in FIG. 12A. When the reset signal line in the j-th row (Rj) is selected, a signal of $V_{dd}$ (Hi) potential is inputted to the gate electrode of the n-channel reset transistor 1140. At the same time, a potential of the drain region of the reset transistor 1140 which is connected to the power source supply line (VBi) becomes $V_{dd}$.

At this time, if the voltage $V_{gs}$ between the gate and the source of the reset transistor 1140 is larger than $V_{thN}$, the reset transistor 1140 becomes an ON-state. Conversely, if $V_{gs}$ is smaller than $V_{thN}$, then the reset transistor 1140 becomes an OFF-state, so that a voltage supplied through the power source supply line (VBi) does not reach the n-channel-side terminal of the photoelectric conversion element 1110. That is, the potential difference $V_{pd}$ between both electrodes of the photoelectric conversion element 1110 does not become greater than the value $(V_{dd}-V_{thN})$ obtained by subtracting the threshold voltage $V_{thN}$ for the reset transistor 1140 from the potential $V_{dd}$ of the power source supply line (VBi).

Next, description will be made of a relationship between an intensity of light irradiated onto the photoelectric conversion element 1110 and a potential of the photoelectric conversion element 1110, with reference made to FIG. 12B. As described above, the potential difference $V_{pd}$ between the both electrodes of the photoelectric conversion element 1110 does not become greater than the value $(V_{dd}-V_{thN})$ obtained by subtracting the threshold voltage $V_{thN}$ from the potential $V_{dd}$ of the power source supply line (VBi). Therefore, the greater the threshold voltage $V_{thN}$, the greater becomes the attenuation of amplitude, so that a sufficient signal amplitude cannot be attained with respect to the potential difference $V_{pd}$ between the both terminals of the photoelectric conversion element 1110. That is, the greater the)threshold value $V_{thN}$ becomes, the more difficult it becomes to sufficiently raise the potential of the n-channel-side terminal of the photoelectric conversion element 1110. As a result, changes in the potential of the photoelectric conversion element 1110 become so minuscule that there will be little noticeable difference among signals outputted from the pixel 100. In such a case, it becomes difficult to read information of a subject with precision.

Next, description will turn to a case where all the transistors included in the pixel 100 are constituted by p-channel transistors, with reference made to FIG. 14A. Note that a threshold voltage of the p-channel reset transistor 1140 is denoted by a symbol $V_{thP}$. In the pixel 100 shown in FIG. 14A, the n-channel-side terminal of the photoelectric conversion element 1110 is connected to the power source line 1210, and the p-channel-side terminal thereof is connected to the source region of the reset transistor 1140.

In the arrangement shown in FIG. 14A, when a signal of $V_{ss}$ (Hi) potential is inputted to the reset transistor 1140, the reset transistor 1140 becomes an ON-state. At this time, the potential of the drain region of the reset transistor 1140 is $V_{ss}$, while the potential of the source region thereof becomes equal to the value $(V_{ss}+|V_{thP}|)$ obtained by adding together the potential $V_{ss}$ of the power source supply line (VBi) and a threshold voltage thereof. Accordingly, it follows that the potential difference $V_{pd}$ between the both terminals of the photoelectric conversion element 1110 does not become greater than the value obtained by subtracting the sum $(V_{ss}+|V_{thP}|)$ of the potential $V_{ss}$ of the power source supply line (VBi) and the threshold voltage from the potential $V_{dd}$ of the power source supply line (VBi). In other words, the potential of the photoelectric conversion element 1110 does not become greater than the value of $V_{dd}-(V_{ss}+|V_{thP}|)$.

Summarizing the foregoing description, the pixels respectively shown in FIGS. 11A, 12A, and 14A each include: three transistors consisting of the switching transistor 1120, the amplification transistor 1130, and the reset transistor 1140; and the photoelectric conversion element 1110. Thus, the three pixels are identical in configuration. However, conductivity types of the transistors differ among the three pixels, as is manifested in the fact that the reset transistor 1140 is a p-channel transistor in FIGS. 11A and 14A, whereas it is an n-channel transistor in FIG. 12A As described hereinabove, in the pixel shown in FIG. 11A the reset transistor 1140 is a p-channel transistor and the potential difference $V_{pd}$ between the both electrodes of the photoelectric conversion element 1110 can be sufficiently raised to the power source potential $V_{dd}$. On the other hand, in the pixel shown in FIG. 12A the reset transistor 1140 is an n-channel transistor and the potential $V_{pd}$ between the both terminals of the photoelectric conversion element 1110 experiences amplitude attenuation whereby it does not become greater than the value $(V_{dd}-V_{thN})$ obtained by subtracting the threshold voltage $V_{thN}$ from the power source potential $V_{dd}$. Also, in the pixel shown in FIG. 14A the reset transistor 1140 is a p-channel transistor and the potential difference between the both terminals of the photoelectric conversion element similarly experiences amplitude attenuation whereby it does not become greater than the value of $V_{dd}-(V_{ss}+|V_{thP}|)$.

In a semiconductor device, semiconductor elements such as transistors are typically manufactured on an insulating surface or a semiconductor substrate. The resulting complexity of its manufacture has been the source of reduced yield and increased manufacturing costs. Accordingly, utmost simplification of the manufacturing process is a primary object in achieving increased yield and reduced costs. In view of this, the present inventor has conceived of using transistors having a single polarity (i.e. having the same conductivity type) for the pixel portion and for the peripheral driver circuits (the source signal line driver circuit, the gate signal line driver circuit, and the like).

Incidentally, in the pixel 100 shown in FIG. 12A, all the transistors are constituted by n-channel transistors. Thus, the pixel 100 is constituted by transistors having a single polarity. Likewise, all the transistors included in the pixel 100 shown in FIG. 14A are p-channel transistors, and thus the pixel 100 is constituted by transistors having a single polarity. However, amplitude attenuation occurs in the above-mentioned pixels, thus making it impossible to attain a sufficient signal amplitude.

In the pixel 100 shown in FIG. 11A, the potential difference $V_{pd}$ between the both electrodes of the photoelectric conversion element 1110 is raised to the power source potential $V_{dd}$ in order to attain a sufficient signal amplitude. However, the pixel 100 includes transistors having mutually different conductivity types, which adds complexity to its manufacture.

To conclude, when the pixel is constituted by transistors having a single polarity (i.e. having the same conductivity type) with the conventional pixel configuration, although the number of manufacturing steps can be reduced, it becomes impossible to attain a sufficient signal amplitude.

SUMMARY OF THE INVENTION

The present invention has been devised in view of the above problems. Therefore, an object of the invention is to provide a semiconductor device in which the number of manufacturing steps is reduced by using transistors having a single polarity (i.e. having the same conductivity type) to constitute each pixel, thereby achieving increased yield and reduced costs. Another object of the present invention is to provide a semiconductor device in which a photoelectric conversion element can attain a sufficient signal amplitude.

In order to attain the above objects, according to the present invention, there is provided a semiconductor device in which each pixel is provided with an electric circuit (a bootstrap circuit) for generating an electric potential that is higher than a voltage given through capacitative coupling. Further, according to the present invention, there is provided a semiconductor device in which a sufficient signal amplitude can be attained by using the above electric circuit to set a potential difference between both terminals of a photoelectric conversion element to the same value as the power source potential. Still further, according to the present invention, there is provided a semiconductor device in which the number of manufacturing steps are reduced by using transistors having a single polarity to constitute each pixel, to thereby achieve increased yield and reduced costs.

Brief explanation will be given with respect to a pixel provided in a semiconductor device of the present invention, with reference to FIG. 14B. Referring to FIG. 14B, the pixel 100 comprises a switching element, an amplification element, a reset element, and a bootstrap circuit. Semiconductor elements such as transistors are used for the switching element. Further, the bootstrap circuit is constituted by a semiconductor element, a capacitive element, and the like, which has a function of generating an electric potential that is higher than a voltage given through capacitative coupling. According to the present invention, a phenomenon in which a potential difference between both terminals of a photoelectric conversion element experiences amplitude attenuation by an amount corresponding to a threshold voltage of the reset element is overcome by using the bootstrap circuit so that a sufficient signal amplitude can be obtained with respect to the potential difference between both terminals of the photoelectric conversion element.

According to the present invention configured as described above, it is possible to provide a semiconductor device in which the number of manufacturing steps is reduced by using transistors having a single polarity (i.e. having the same conductivity type), thereby achieving increased yield and reduced costs. Also, according to the present invention, it is possible to provide a semiconductor device in which a photoelectric conversion element thereof can attain a sufficient signal amplitude, whereby the photoelectric conversion element can read out a subject with higher precision.

That is, according to the present invention, there is provided a semiconductor device having a plurality of pixels each comprising: a plurality of transistors; a photoelectric conversion element having two electrodes; power source supply means; and a bootstrap circuit, characterized in that the bootstrap circuit has means for setting a potential difference between the both electrodes of the photoelectric conversion element to the same potential as the power source supply means, and the plurality of transistors included in each of the pixels have the same conductivity type.

The semiconductor device described above is further characterized in that:

the above-mentioned means which the bootstrap circuit has for setting a potential difference between the both electrodes of the photoelectric conversion element to the same potential as the power source supply means comprises:

a discharge transistor for setting the both electrodes of the photoelectric conversion element to the same potential;

a boot transistor which has a gate electrode, a first electrode, and a second electrode and which is turned off when a signal is inputted to the first electrode, the gate electrode being connected to the power source supply means;

a capacitive element arranged between the photoelectric conversion element and the second electrode of the boot transistor; and a reset transistor having a gate electrode that is set to a potential higher than that of the power source supply means due to capacitative coupling by the capacitive element; and the plurality of transistors included in each of the pixels have the same conductivity type.

According to the present invention, there is provided a semiconductor device having a plurality of pixels each comprising: a plurality of transistors; a photoelectric conversion element having first and second terminals; power source supply means; a bootstrap circuit; a discharge signal line; and a reset signal line, characterized in that:

the bootstrap circuit comprises:

a discharge transistor, a boot transistor, and a reset transistor each having a gate electrode, a source region, and a drain region; and a capacitive element having first and second terminals;

the gate electrode of the discharge transistor is connected to the discharge signal line;

one of the source region and the drain region of the discharge transistor is connected to the first terminal of the photoelectric conversion element, and the other is grounded;

the gate electrode of the boot transistor is connected to the power source supply means;

one of the source region and the drain region of the boot transistor is connected to the reset signal line, and the other is connected to the gate electrode of the reset transistor and to the first terminal of the capacitive element;

the gate electrode of the reset transistor is connected to the first terminal of the capacitive element;

one of the source region and the drain region of the reset transistor is connected to the power source supply means, and the other is connected to the second terminal of the capacitive element and to the first terminal of the photoelectric conversion element; and the plurality of transistors included in each of the pixels have the same conductivity type.

The semiconductor device described above may further include a light emitting element and is characterized in that light emitted from the light emitting element is irradiated onto a subject and light reflected by the subject is irradiated onto the photoelectric conversion element.

DETAILED DESCRIPTION OF THE PREFERRED EMBODIMENTS

[Embodiment Mode]

Embodiment mode of the present invention will be described with reference to FIG. 1A to FIG. 4.

Figure 4:
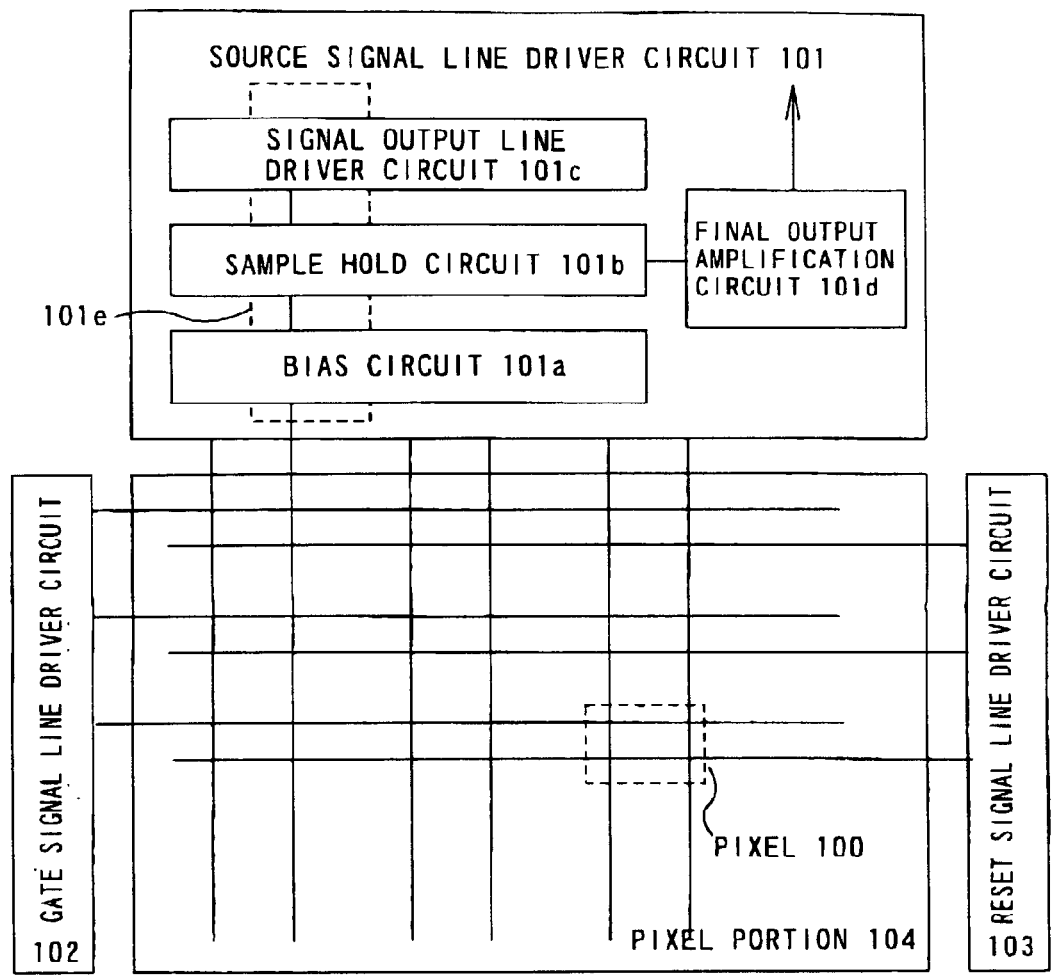
FIG. 4 is a schematic diagram of a semiconductor device.

FIG. 4 is a schematic diagram of a semiconductor device. The semiconductor device shown in FIG. 4 includes a pixel portion 104 as well as a source signal line driver circuit 101 and a gate signal line driver circuit 102 that are arranged in the periphery of the pixel portion 104. Here, although there are provided one source signal line driver circuit 101 and one gate signal line driver circuit 102 in this embodiment mode, the present invention is not limited to this. The number of the gate signal line driver circuit 102, a reset signal line driver circuit 103, and the like may be set as desired in accordance with the configuration of a pixel 100. Further, the source signal line driver circuit 101 shown in FIG. 4 includes a bias circuit 101$a$, a sample hold circuit 101$b$, a signal output line driver circuit 101$c$, and a final output amplification circuit 101$d$. However, the present invention is not limited to this configuration; in addition to those mentioned above, the source signal line driver circuit 101 may further include an analog/digital signal conversion circuit, a noise reducing circuit, and the like.

The pixel portion 104 includes a plurality of pixels 100 arranged in matrix. More specifically, the pixel portion 104 includes x (vertical columns) times y (horizontal rows) pixels 100 (x and y are natural numbers).

Within the pixel portion 104, description will be made of one pixel 100 arranged in i-th column-and j-th row of the matrix arrangement, with reference made to FIG. 1A. The pixel 100 is arranged within an area defined by: one of signal output lines ($S_1$ to $S_x$); one of power source supply lines ($VB_1$ to $VB_x$); one of gate signal lines ($G_1$ to $G_y$); one of reset signal lines ($R_1$ to $R_y$); and one of discharge signal lines ($H_1$ to $H_y$). Further, the pixel 100 includes a switching transistor 112, an amplification transistor 113, a reset transistor 114, a boot transistor 115, a capacitor 116, a discharge transistor 117, and a photoelectric conversion element 111. The boot transistor 115, the capacitor 116, and the discharge transistor 117 together constitute a bootstrap circuit.

The photoelectric conversion element 111 has an n-channel-side terminal, a p-channel-side terminal, and a photoelectric conversion layer provided between the n-channel-side terminal and the p-channel-side terminal. One of the n-channel-side terminal and the p-channel-side terminal is connected to a power source reference line 121 and the other is connected to a gate electrode of the amplification transistor 113.

The gate electrode of the switching transistor 112 is connected to the gate signal line (Gj). One of the source region and the drain region of the switching transistor 112 is connected to the source region of the amplification transistor 113 and the other is connected to the signal output line (Si). The switching transistor 112 functions as a switching element when outputting a signal from the photoelectric conversion element 111 to the source signal line driver circuit 101.

The drain region of the amplification transistor 113 is connected to a power source supply line (VBi). The source region of the amplification transistor 113 is connected to one of the source region and the drain region of the switching transistor 112. The amplification transistor 113 constitutes a source follower circuit together with a bias transistor (not shown) arranged on the circuitry surrounding the pixel portion 104. Accordingly, it is preferable that the amplification transistor 113 and the bias transistor have the same polarity.

The gate electrode of the reset transistor 114 is connected to the reset signal line (Rj) via the boot transistor 115. One of the source region and the drain region of the reset transistor 114 is connected to the power source supply line (VBi) and the other is connected to the photoelectric conversion element 111 and to the gate electrode of the amplification transistor 113. The reset transistor 114 functions as a switching element for initializing (resetting) the photoelectric conversion element 111.

The gate electrode of the boot transistor 115 is connected to the power source supply line (VBi). One of the source region and the drain region of the boot transistor 115 is connected to the reset signal line (Rj) and the other is connected to the gate electrode of the reset transistor 114 and to one terminal of the capacitor 116.

The gate electrode of the discharge transistor 117 is connected to the discharge signal line (Hj). As for the source region and the drain region of the discharge transistor 117, one is connected to one terminal of the photoelectric conversion element 111 and the other is connected to a power source reference line 118.

Figure 1A:
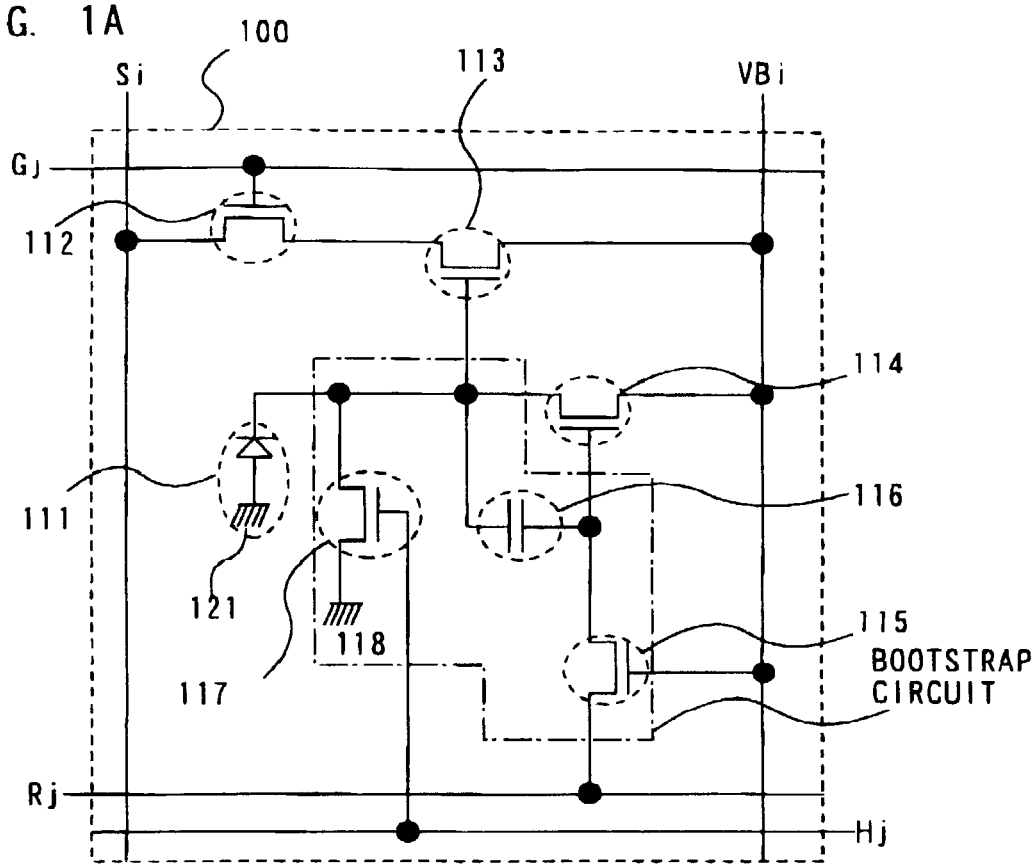
FIGS. 1A and 1B are circuit diagrams showing a pixel in a semiconductor device.

Next, description will turn to operations of the pixel 100 described in FIG. 1A, with reference made to FIG. 1B and FIGS. 2A to 3. Here, all the transistors that make up the pixel 100 are assumed to be n-channel transistors, and a threshold voltage for each transistor is denoted as $V_{thN}$.

Operations of the pixel 100 to be explained herein-below are roughly divided into an initialization operation and a reset operation. An initialization operation refers to an operation for sufficiently lowering a potential of the n-channel-side terminal of the photoelectric conversion element 111. More specifically, it refers to an operation for lowering the potential of the n-channel-side terminal of the photoelectric conversion element 111 to a potential $V_{ss}$ of the power source reference line so that a potential difference between both electrodes of the photoelectric conversion element 111 becomes zero. On the other hand, a reset operation refers to an operation for sufficiently raising the potential of the n-channel-side terminal of the photoelectric conversion element 111. More specifically, it refers to an operation for raising the potential of the n-channel-side terminal of the photoelectric conversion element 111 to a potential $V_{dd}$ of the power source supply line so that the potential difference between both electrodes of the photoelectric conversion element 111 becomes equal to $V_{dd}$.

Figure 1B:
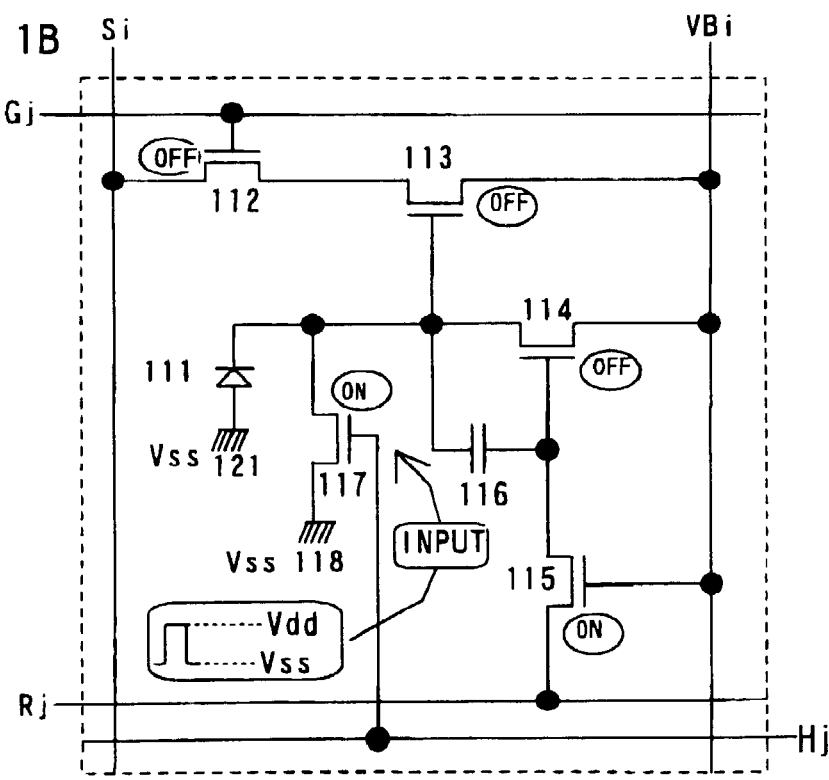
Figure 2A:
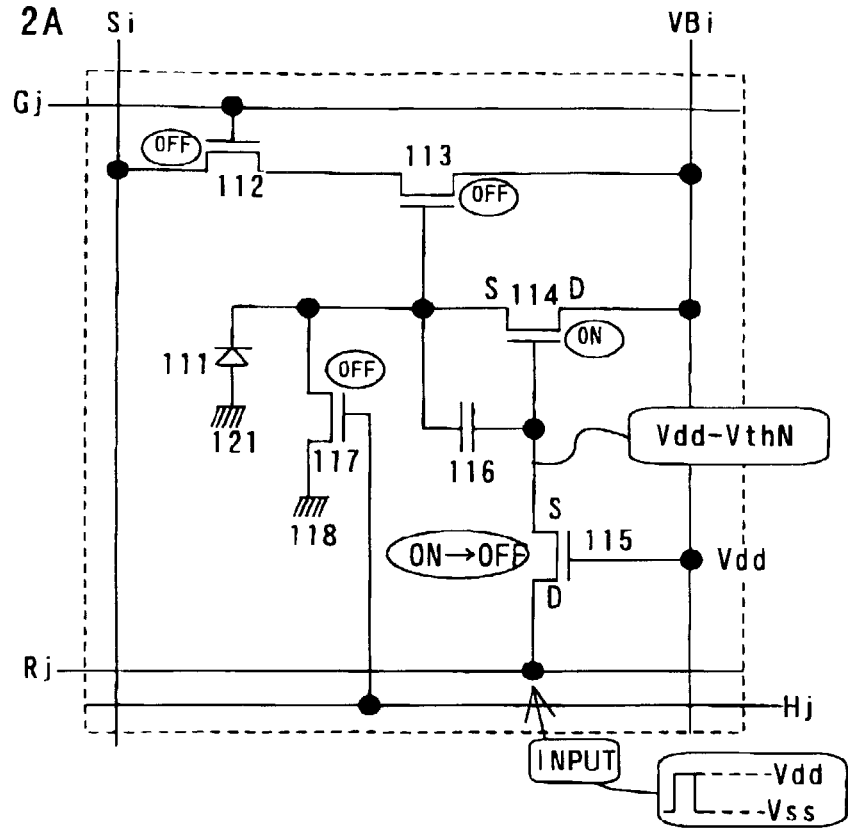
FIGS. 2A and 2B are circuit diagrams showing a pixel in a semiconductor device.
Figure 2B:
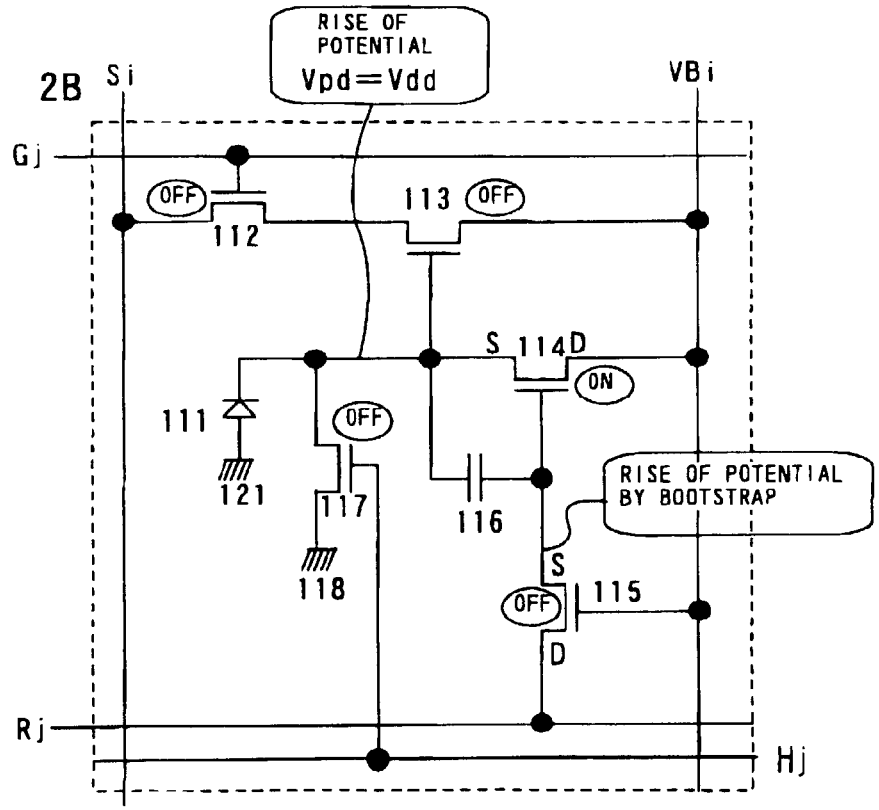
Figure 3:
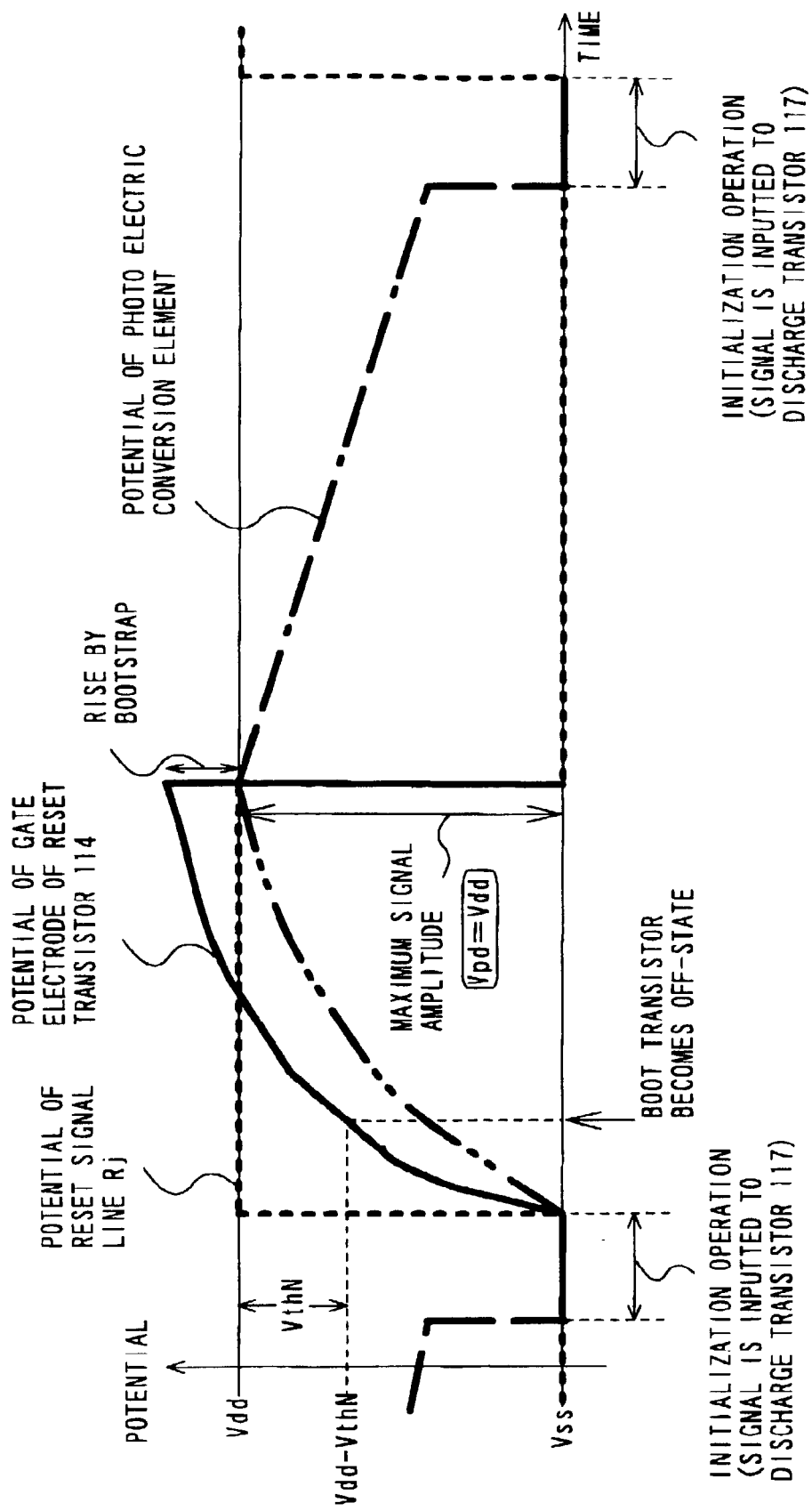
FIG. 3 is a chart indicating a relationship between a potential of a photoelectric conversion element and time.

Note that FIG. 1B shows the pixel 100 in the case where the initialization operation is performed, whereas FIGS. 2A and 2B show the pixel 100 in the case where the reset operation is performed. Further, FIG. 3 shows a relationship among a potential of the photoelectric conversion element 111, a potential of the gate electrode of the reset transistor 114, and time. Incidentally, FIGS. 1B through 2B are shown in time sequence and the abscissa in FIG. 3 indicates time. Thus, time correspondence between FIGS. 2A and 2B and FIG. 3 will be readily recognized.

First, the initialization operation of the pixel 100 will be described with reference to FIG. 1B. In FIG. 1B, when the discharge signal line (Hj) in the j-th row is selected, a signal ($V_{dd}$ (Hi)) is inputted to the discharge transistor 117 connected to the discharge signal line (Hj) so that the discharge transistor 117 becomes an ON-state. Accordingly, a potential of the n-channel-side terminal of the photoelectric conversion element 111 is sufficiently lowered to a potential $V_{ss}$ of the power source reference line 118 so that a potential difference between both electrodes of the photoelectric conversion element 111 can be made zero. Note that, as shown in FIG. 3, the potential of the power source line 121 is set to $V_{ss}$.

Next, description will be given of the reset operation of the pixel 100 with reference to FIGS. 2A and 2B. Here, a potential of the gate electrode of the boot transistor 115 that is connected to the power source supply line (VBi) is $V_{dd}$ and in an ON-state. At this time, one region of the boot transistor 115 which is connected to the reset signal line (Rj) is the drain region, and the other region thereof is the source region.

The boot transistor 115 becomes an ON-state when a voltage $V_{gs}$ between its gate and source is larger than the threshold voltage $V_{thN}$, and when this $V_{gs}$ becomes smaller than $V_{thN}$, the boot transistor 115 becomes an OFF-state. That is, a potential difference between the source region of the boot transistor 115 and the gate electrode of the reset transistor 114 does not become greater than the value ($V_{dd}-V_{thN}$) obtained by subtracting the threshold voltage $V_{thN}$ from the potential $V_{dd}$ of the power source supply line (VBi).

When the reset signal line (Rj) in the j-th row is selected in this state, a signal is inputted to the gate electrode of the reset transistor 114 so that the reset transistor 114 becomes an ON-state. Here, the signal inputted to the reset transistor 114 will have the potential $V_{dd}$ (Hi) barring any changes. However, the potential of the source region of the boot transistor 115 does not become greater than the value ($V_{dd}-V_{thN}$). Hence, in actuality, a signal whose potential is not greater than the value ($V_{dd}-V_{thN}$) is inputted to the gate electrode of the reset transistor 114, rather than a signal whose potential is $V_{dd}$ (Hi).

Description will now be given of a relationship between a potential of the gate electrode of the reset transistor 114 and time, with reference to FIG. 3. Referring to FIG. 3, when a signal ($V_{dd}$(Hi)) is inputted to the reset transistor 114, a potential of the gate electrode of the reset transistor 114 begins to rise gradually. Following this, a potential of the n-channel-side terminal of the photoelectric conversion element 111 also begins to rise gradually. Then, when the potential of the gate electrode of the reset transistor 114 has risen to reach the value ($V_{dd}-V_{thN}$), $V_{gs}$ of the boot transistor 115 becomes equal to the threshold voltage $V_{thN}$ so that the boot transistor 15 turns to an OFF-state. At the same time, the potential of the source region of the boot transistor 115 becomes the value ($V_{dd}-V_{thN}$), so that the gate electrode of the reset transistor 114 temporarily attains a floating state.

In this state, the potential of the gate electrode of the reset transistor 114 and the potential of the source region of the boot transistor 115 are raised through capacitative coupling using a bootstrap method. As shown in FIG. 3, the potential of the photoelectric conversion element 111 continues to rise even after the boot transistor 115 becomes an OFF-state. This is because the potential of the gate electrode of the reset transistor 114 continues to rise gradually due to amplitude compensation attained through the capacitative coupling.

As the potential of the gate electrode of the reset transistor 114 thus rises, the potential of the n-channel-side terminal of the photoelectric conversion element 111 also rises gradually. Here, the maximum signal amplitude between both terminals of the photoelectric conversion element 111 is $V_{dd}$.

Subsequently, the reset transistor 114 turns to an OFF-state and the storage time begins. Then, the potential of the n-channel-side terminal of the photoelectric conversion element 111 begins to fall gradually in accordance with an intensity of light irradiated thereto. When the storage time ends after an elapse of a certain fixed period, the gate signal line (Gj) in the j-th row is selected. When the gate signal line (Gj) is selected, the switching transistor 112 turns to an ON-state. When this happens, a signal from the pixel 100 is outputted to the signal output line (Si) via the amplification transistor 113 and the switching transistor 112. One frame period ends when the signal from the pixel 100 is thus outputted to the signal output line (Si). Then, the next frame period is started and the above operation is repeated over again.

In accordance with the present invention configured as described above, it is possible to realize a semiconductor device in which the number of manufacturing steps is reduced by using transistors having a single polarity (i.e. having the same conductivity type) to constitute each pixel, thereby achieving improved yield and reduced manufacturing costs. Further, according to the present invention, it is possible to realize a semiconductor device in which a sufficient signal amplitude can be attained with respect to a photoelectric conversion element.

[Embodiment 1]

In Embodiment 1, description will be made with respect to a case where the present invention is applied to a semiconductor device in which a light emitting element and a photoelectric conversion element are provided in each pixel, with reference to FIGS. 7 to 8.

Figure 7:
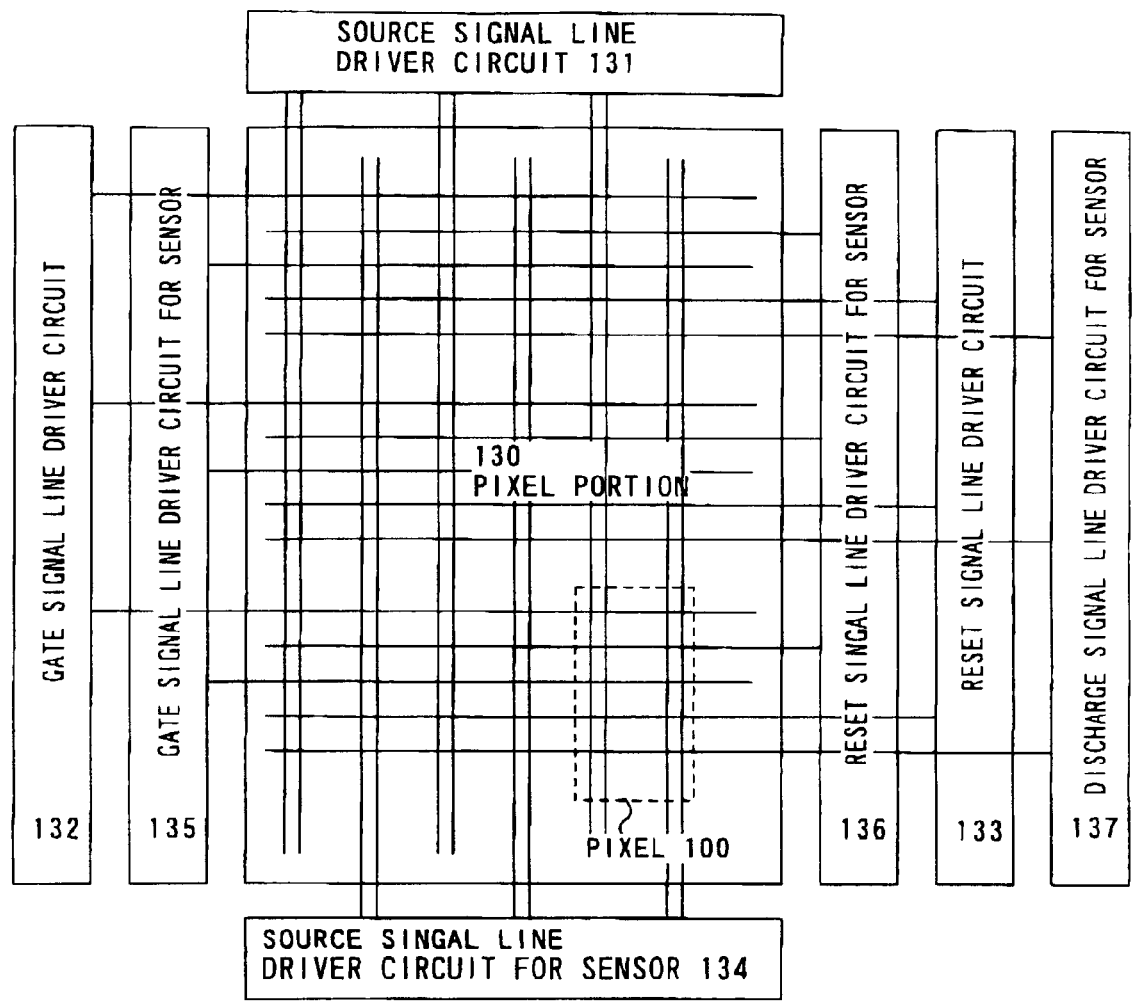
FIG. 7 is a schematic diagram of a semiconductor device.

FIG. 7 is a schematic diagram showing a semiconductor device of the present invention. The semiconductor device shown in FIG. 7 includes a pixel portion 130 and a plurality of driver circuits arranged in the periphery of the pixel portion 130. The pixel portion 130 is roughly divided into a light-emitting-element portion and a sensor portion. The plurality of driver circuits include: a source signal line driver circuit 131, a gate signal line driver circuit 132, and a reset signal line driver circuit 133 which perform control of the light-emitting-element portion; and a source signal line driver circuit 134 for sensor, a gate signal line driver circuit 135 for sensor, a reset signal line driver circuit 136 for sensor, and a discharge signal line driver circuit 137 for sensor, which perform control of the sensor portion.

It is to be noted that the present invention is not limited to the above configuration. By providing an output switching circuit or the like, the gate signal line driver circuit 132 and the gate signal line driver circuit 135 for sensor may be provided as one integral circuit, or the reset signal line driver circuit 133 and the reset signal line driver circuit 136 for sensor may be provided as one integral circuit.

The pixel portion 104 includes a plurality of pixels 100 arranged in matrix. More specifically, the pixel portion 104 is made up of x (vertical columns) times y (horizontal rows) pixels 100.

Description will be given of one pixel 100 arranged in i-th column and j-th row of the thus configured pixel portion 104, with reference to FIG. 8. Note that the pixel 100 comprises a light-emitting-element portion and a sensor portion. The light-emitting-element portion is arranged within an area defined by: one of source signal lines ($S_1$ to Sx); one of power source reference lines ($V_1$ to Vx); one of gate signal lines ($EG_1$ to EGy); and one of reset signal lines ($ER_1$ to ERy). Also, the light-emitting-element portion includes a selection transistor 126, a reset transistor 127, a capacitor 128, a driver transistor 129, and a light emitting element 125. One terminal of the light emitting element 125 is connected to a power source line 153 ($V_{dd}$).

The sensor portion is arranged within an area defined by: one of source signal lines ($SS_1$ to SSx); one of power source reference lines ($VB_1$ to VBx); one of gate signal lines ($SG_1$ to SGy); one of reset signal lines ($SR_1$ to SRy); and one of discharge signal lines ($H_1$ to Hy). Also, the sensor portion includes a switching transistor 142, an amplification transistor 143, a reset transistor 144, a boot transistor 145, a capacitor 146, a discharge transistor 147, and a photoelectric conversion element 141. One terminal of the photoelectric conversion element is connected to a power source line 151 ($V_{dd}$). One of the source region and the drain region of the discharge transistor 147 is connected to a power source line 148 ($V_{dd}$).

Figure 8:
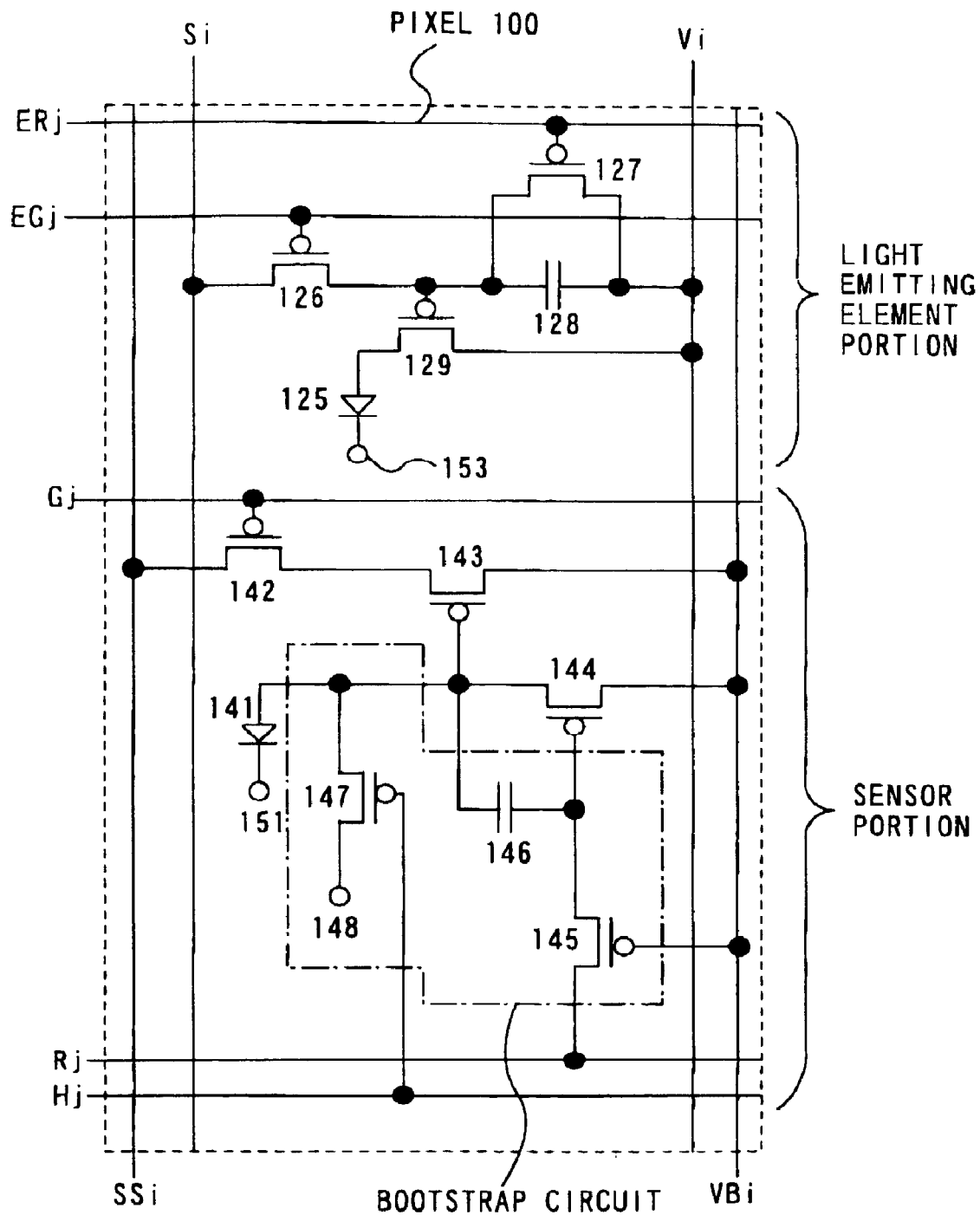
FIG. 8 is a circuit diagram showing a pixel in a semiconductor device.

In this embodiment, all the transistors that make up the pixel 100 shown in FIG. 8 are p-channel transistors. Amplitudes of signals inputted to these transistors are set to $V_{ss}$ (Hi) to $V_{dd}$ (L0). Further, in the initial state, the respective potentials of the source signal line (S), the gate signal line (EG), the reset signal line (ER), and the power source reference line (V) are set to $V_{ss}$. Further, the respective potentials of the signal output line (SS), the gate signal line (G), the sensor reset signal line (R), and the power source supply line (VB) are set to $V_{ss}$. The respective potentials of the power source lines 153, 151, and 148 are set to $V_{dd}$.

Next, description will turn to configuration of the light-emitting-element portion in the pixel 100.

The light emitting element 125 is composed of an anode, a cathode, and an organic compound layer provided between the anode and the cathode. When the anode is connected to the source region or the drain region of the driving transistor 129, the anode serves as a pixel electrode while the cathode serves as an opposing electrode. Conversely, when the cathode is connected to the source region or the drain region of the driver transistor 129, the cathode serves as the pixel electrode while the anode serves as the opposing electrode. Since the driver transistor 129 is a p-channel transistor in this embodiment, the anode of the light emitting element 125 is connected to the source region or the drain region of the driver transistor and the cathode thereof is connected to the power source line 153 ($V_{dd}$).

In this specification, the light emitting element has a configuration in which the organic compound layer is sandwiched between a pair of electrodes (the anode and the cathode). The organic compound layer may be fabricated with a known luminescent material. An organic compound layer generally takes one of a single layer structure and a lamination structure; either of the two structures may be employed for the present invention. Luminescence produced by an organic compound layer include light emission upon return from the singlet excited state to the ground state (fluorescence) and light emission upon return from the triplet excited state to the ground state (phosphorescence). The present invention may be applied to light emitting devices which exhibit either form of light emission.

The gate electrode of the selection transistor 126 is connected to the gate signal line (EGj). One of the source region and the drain region of the selection transistor 126 is connected to the source signal line (Si) and the other is connected to the gate electrode of the driver transistor 129. The selection transistor 126 serves as a switching element when a signal is written into the light-emitting-element portion.

One of the source region and the drain region of the driver transistor 129 is connected to the power source reference line (Vi) and the other is connected to the light emitting element 125. The capacitor 128 is coupled to the gate electrode of the driver transistor 129 and to the power source reference line (Vi). The driver transistor 129 functions as an element (a current control element) for controlling an electric current supplied to the light emitting element 125.

One of the source region and the drain region of the reset transistor 127 is connected to the power source reference line (Vi) and the other is connected to the gate electrode of the driver transistor 129. The gate electrode of the reset transistor 127 is connected to the reset signal line (ERj). The reset transistor 127 functions as an element for erasing (resetting) a signal that has been written into the light-emitting-element portion of the pixel 100.

Next, description will turn to configuration of the sensor portion in the pixel 100.

The photoelectric conversion element 141 has an n-channel-side terminal and a p-channel-side terminal as well as a photoelectric conversion layer provided between the n-channel-side terminal and the p-channel-side terminal. With respect to the n-channel-side terminal and the p-channel-side terminal, one is connected to the power source line 151 ($V_{dd}$) and the other is connected to the gate electrode of the amplification transistor 143.

The gate electrode of the switching transistor 142 is connected to the gate signal line (Gj). As for the source region and the drain region of the switching transistor 142, one is connected to the source region of the amplification transistor 143 and the other is connected to the signal output line (SSi). The switching transistor 142 functions as a switching element when a signal is outputted to the photoelectric conversion element 141.

The drain region of the amplification transistor 143 is connected to the power source reference line (VBi). Also, the source region of the amplification transistor 143 is connected to the source region or the drain region of the switching transistor 142. The amplification transistor 143 forms a source follower circuit together with a bias transistor (not shown) arranged on the source signal line driver circuit 134 for sensor. Thus it is preferable that the amplification transistor 143 and the bias transistor have the same polarity.

The gate electrode of the reset transistor 144 is connected to the sensor reset signal line (Rj) via the boot transistor 145. As for the source region and the drain region of the reset transistor 144, one is connected to the power source reference line (VBi) and the other is connected to the photoelectric conversion element 141 and to the gate electrode of the amplification transistor 143. The reset transistor 144 functions as an element (switching element) for initializing (resetting) the photoelectric conversion element 141.

The gate electrode of the boot transistor 145 is connected to the power source reference line (VBi). As for the source region and the drain region of the boot transistor 145, one is connected to the reset signal line (Rj) and the other is connected to the gate electrode of the reset transistor 144.

The gate electrode of the discharge transistor 147 is connected to the discharge signal line (Hj). As for the source region and the drain region of the discharge transistor 147, one is connected to one terminal of the photoelectric conversion element 141 and to the gate electrode of the amplification transistor, and the other is connected to the power source line 148 ($V_{dd}$).

Further, the boot transistor 145, the capacitive element 146, and the discharge transistor 147 together constitute a bootstrap circuit.

The semiconductor device according to this embodiment has the following two functions, that is, a readout function whereby readout of a subject is performed using both of the light-emitting-element portion and the sensor portion and a display function whereby an image is displayed using only the light-emitting-element portion. The above two functions will be described briefly below. As regards the former, i.e. the readout function, light emitted from the light emitting element 125 is irradiated to a subject, and light reflected by the subject is subjected to photoelectric conversion by the photoelectric conversion element 141 arranged on the sensor portion. Information on the subject is thus read out, which is then stored in the form of an image signal on a storage medium such as a memory provided in the semiconductor device. As regards the latter, i.e. the display function, an image is displayed using an image signal of a subject read out by the photoelectric conversion element 141.

The respective configurations and connection arrangements of the elements included in the pixel 100 shown in FIG. 8 are identical to those of the pixel 100 shown in FIG. 1 which have been explained in the above embodiment mode. However, while all the transistors are constituted by n-channel transistors in the case of the pixel 100 shown in FIG. 1, all the transistors included in the pixel 100 shown in FIG. 8 are constituted by p-channel transistors. Accordingly, the potentials of the power source supply lines and of the power source lines are different between the both pixels. Also, since operations of the pixel 100 shown in FIG. 8 are similar to those described in the aforementioned embodiment mode, detailed description of the operations is omitted in this embodiment.

In accordance with the present invention configured as described above, there can be provided a semiconductor device in which the number of manufacturing steps is reduced by using transistors having a single polarity (i.e. having the same conductivity type) to constitute each pixel, thereby achieving increased yield and reduced costs. Further, in accordance with the present invention, there can be provided a semiconductor device in which a photoelectric conversion element thereof can attain a sufficient signal amplitude.

[Embodiment 2]

This embodiment gives a description of methods of manufacturing a pixel portion in which photoelectric conversion elements and transistors are provided on the same insulator surface and a driver circuit formed in the periphery of the pixel portion by single polarity transistor with references to FIGS. 5 and 6.

Figure 5A:
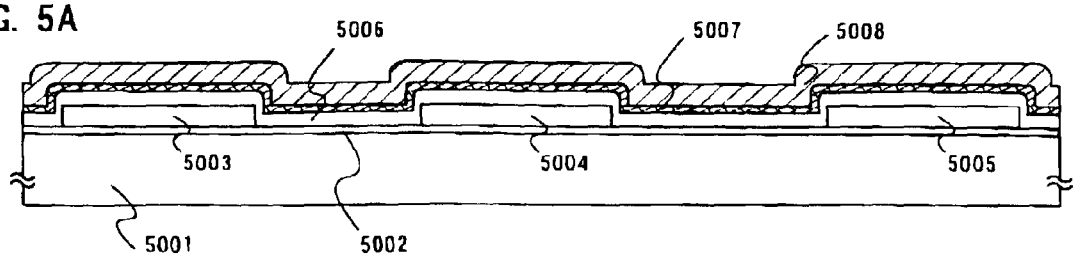
FIGS. 5A to 5D are views showing manufacturing steps of a semiconductor device.

First, as shown in FIG. 5A, a base film 5002 is formed from an insulating film such as a silicon oxide film, a silicon nitride film, and a silicon oxynitride film on a glass substrate 5001. The substrate 5001 is formed of barium borosilicate glass typical example of which is Corning #7059 glass or Corning #1737 glass (product of Corning Incorporated), or of aluminoborosilicate glass. The base film 5002 is, for example, (not shown) a laminate of a silicon oxynitride film that is formed from $SiH_4$, $NH_3$, and $N_2O$ by plasma CVD to a thickness of 10 to 200 nm (preferably 50 to 100 nm) and a silicon oxynitride hydride film formed from $SiH_4$ and $N_2O$ by plasma CVD to a thickness of 50 to 200 nm (preferably 100 to 150 nm).

A semiconductor film having an amorphous structure is crystallized by laser crystallization or a known thermal crystallization method to form a crystalline semiconductor film. The crystalline semiconductor film makes island-like semiconductor layers 5003 to 5005. The island-like semiconductor layers 5003 to 5005 each have a thickness of 25 to 80 nm (preferably 30 to 60 nm). No limitation is put on the choice of material of the crystalline semiconductor film but it is preferable to use silicon or a silicon germanium (SiGe) alloy.

When the crystalline semiconductor film is formed by laser crystallization, a pulse oscillation-type or continuous wave excimer laser, YAG laser, or $YVO_4$ laser is used. Laser light emitted from a laser oscillator as those given in the above is desirably collected into a linear beam by an optical system before irradiating the semiconductor film. However, if an excimer laser is used, the pulse oscillation frequency is set to 30 Hz and the laser energy density is set to 100 to 400 $mJ/cm^2$ (typically 200 to 300 $mJ/cm^2$). If a YAG laser is used, second harmonic thereof is employed and the pulse oscillation frequency is set to 1 to 10 kHz while setting the laser energy density to 300 to 600 $mJ/cm^2$ (typically 350 to 500 $mJ/cm^2$). The laser light is collected into a linear beam having a width of 100 to 1000 μm, for example, 400 μm, to irradiate the entire substrate. The substrate is irradiated with the linear laser light with the beams overlapping each other at an overlap ratio of 80 to 98%.

Next, a gate insulating film 5006 is formed so as to cover the island-like semiconductor layers 5003 to 5005. The gate insulating film 5006 is formed from an insulating film containing silicon by plasma CVD or sputtering to a thickness of 40 to 150 nm. In this embodiment, a silicon oxynitride film having a thickness of 120 nm is used. Needless to say, the gate insulating film is not limited to a silicon oxynitride film but may be a single layer or a laminate of other insulating films containing silicon. For example, if a silicon oxide film is used for the gate insulating film, the film is formed by plasma CVD in which TEOS (tetraethyl orthosilicate) is mixed with $O_2$ and the reaction pressure is set to 40 Pa, the substrate temperature to 300 to 400° C., the frequency is set high to 13. 56 MHZ, and the power density is set to 0.5 to 0.8 W/cm$^2$ for electric discharge. The silicon oxide film thus formed can provide the gate insulating film with excellent characteristics when it is subjected to subsequent thermal annealing at 400 to 500° C.

On the gate insulating film 5006, a first conductive film 5007 and a second conductive film 5008 for forming gate electrodes are formed. In this embodiment, the first conductive film 5007 is a Ta film with a thickness of 50 to 100 nm and the second conductive film 5009 is a W film with a thickness of 100 to 300 nm (FIG. 5A).

The Ta film is formed by sputtering in which Ta as a target is sputtered with Ar. In this case, an appropriate amount of Xe or Kr is added to Ar to ease the internal stress of the Ta film and thus prevent the Ta film from peeling off. The resistivity of a Ta film in α phase is about 20 μΩcm and is usable for a gate electrode. On the other hand, the resistivity of a Ta film in β phase is about 180 μΩcm and is not suitable for a gate electrode. A Ta film in α phase can readily be obtained when a base with a thickness of about 10 to 50 nm is formed from tantalum nitride (TaN) that has a crystal structure approximate to that of the α phase Ta film.

The W film is formed by sputtering with W as a target. Alternatively, the W film may be formed by thermal CVD using tungsten hexafluoride (WF$_6$). In either case, the W film has to have a low resistivity in order to use the W film as a gate electrode. A desirable resistivity of the W film is 20 μΩcm or lower. The resistivity of the W film can be reduced by increasing the crystal grain size but, if there are too many impurity elements such as oxygen in the W film, crystallization is inhibited to raise the resistivity. Accordingly, when the W film is formed by sputtering, a W target with a purity of 99.9999% is used and a great care is taken not to allow impurities in the air to mix in the W film being formed. As a result, the W film can have a resistivity of 9 to 20 μΩcm.

Although the first conductive film 5007 is a Ta film and the second conductive film 5008 is a W film in this embodiment, there is no particular limitation. The conductive films may be formed of any element selected from the group consisting of Ta, W, Mo, Al, and Cu, or of an alloy material or compound material mainly containing the elements listed above. A semiconductor film, typically a polycrystalline silicon film doped with an impurity element such as phosphorus, may be used instead. Other desirable combinations of materials for the first and second conductive films than the one shown in this embodiment include: tantalum nitride (TaN) for the first conductive film 5007 and W for the second conductive film 5008; tantalum nitride (TaN) for the first conductive film 5007 and Al for the second conductive film 5008; and tantalum nitride (TaN) for the first conductive film 5007 and Cu for the second conductive film 5008.

Next, a resist mask 5009 is formed to carry out first etching treatment for forming electrodes and wiring lines. In this embodiment, ICP (inductively coupled plasma) etching is employed in which CF$_4$ and Cl$_2$ are mixed as etching gas and an RF (13.56 MHZ) power of 500 W is given to a coiled electrode at a pressure of 1 Pa to generate plasma. The substrate side (sample stage) also receives an RF (13.56 MHZ) power of 100 W so that a substantially negative self-bias voltage is applied. When the mixture of CF$_4$ and Cl$_2$ is used, the W film and the Ta film are etched to the same degree.

Under the above etching conditions, if the resist mask is properly shaped, the first conductive film and the second conductive film are tapered around the edges by the effect of the bias voltage applied to the substrate side. The angle of the tapered portions is 15° to 45°. In order to etch the conductive films without leaving any residue on the gate insulating film, the etching time is prolonged by about 10 to 20%. The selective ratio of the W film to the silicon oxynitride film is 2 to 4 (typically 3), and therefore a region where the silicon oxynitride film is exposed is etched by about 20 to 50 nm by the over-etching treatment. In this way, first shape conductive layers 5010 to 5013 comprising first conductive layers 5010a to 5013a and second conductive layers 5010b to 5013b are formed from the first conductive film and the second conductive film through the first etching treatment. At this point, regions of the gate insulating film 5006 that are not covered with the first shape conductive layers 5010 to 5013 are etched and thinned by about 20 to 50 nm. (FIG. 5B).

Figure 5B:
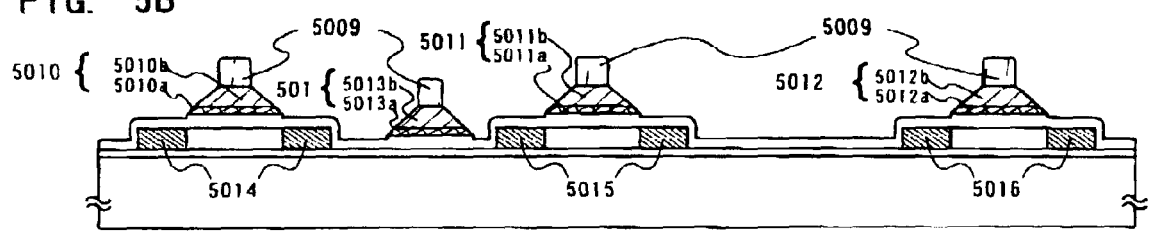

First doping treatment is conducted next for doping of an impurity element that gives the n-type conductivity (FIG. 5B). Ion doping or ion implanting is employed. In ion doping, the dose is set to $1\times10^{13}$ to $5\times10^{14}$ atoms/cm$^2$ and the acceleration voltage is set to 60 to 100 keV. The impurity element that gives the n-type conductivity is an element belonging to Group 15, typically, phosphorus (P) or arsenic (As). Here, phosphorus (P) is used. In this case, the conductive layers 5010 to 5013 serve as masks against the impurity element that gives the n-type conductivity, and first impurity regions 5014 to 5016 are formed in a self-aligning manner. The first impurity regions 5014 to 5016 each contain the impurity element that gives the n-type conductivity in a concentration of $1\times10^{20}$ to $1\times10^{21}$ atoms/cm$^3$.

Figure 5C:
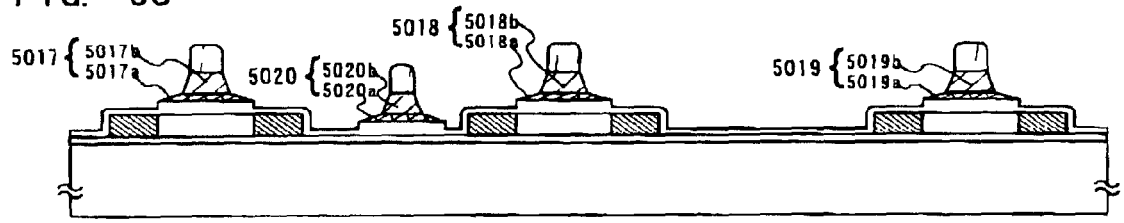

Next, as shown in FIG. 5C, a second etching process is performed. The ICP etching method is similarly used in which CF$_4$, Cl$_2$, and O$_2$ are mixed as the etching gases, and an RF power of 500 W is applied to a coil type electrode under a pressure of 1 Pa to generate plasma. An RF power of 50 W is applied to the side of the substrate (sample stage), and a low self bias voltage as compared with the first etching process is applied thereto. In accordance with the conditions, the W film as the second conductive layer is anisotropically etched, and the Ta film as the first conductive layer is anisotropically etched at an etching rate lower than the W film to form second shape conductive layers 5017 to 5020 (first conductive layers 5017a to 5020a and second conductive layers 5017b to 5020b). Reference numeral 5006 designates a gate insulating film, and regions which are not covered with the second shape conductive layers 5017 to 5020 are etched into a film thickness of about 20 to 50 nm, to for thin regions.

The reaction of the W film and the Ta film to etching by the mixture gas of CF$_4$ and Cl$_2$ can be deduced from the vapor pressure of radical or ion species generated and of reaction products. Comparing the vapor pressure among fluorides and chlorides of W and Ta, WF$_6$ that is a fluoride of W has an extremely high vapor pressure while the others, namely, WCl$_5$, TaF$_5$, and TaCl$_5$ have a vapor pressure of about the same degree. Accordingly, the W film and the Ta film are both fetched with the mixture gas of $CF_4$ and $Cl_2$. However, when an appropriate amount of $O_2$ is added to this mixture gas, $CF_4$ and $O_2$ react to each other to be changed into CO and F, generating a large amount of F radicals or F ions. As a result, the W film whose fluoride has a high vapor pressure is etched at an increased etching rate. On the other hand, the etching rate of the Ta film is not increased much when F ions are increased in number. Since Ta is more easily oxidized than W, the addition of $O_2$ results in oxidization of the surface of the Ta film. The oxide of Ta does not react with fluorine or chlorine and therefore the etching rate of the Ta film is reduced further. Thus, a difference in etching rate is introduced between the W film and the Ta film.

Figure 5D:
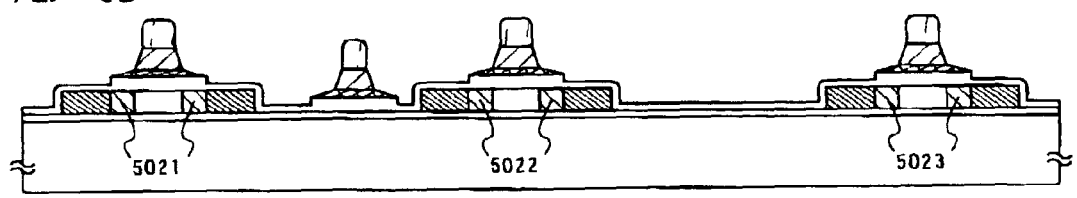

Then second doping treatment is conducted (FIG. 5D). In the second doping treatment, the film is doped with an impurity element that gives the n-type conductivity in a dose smaller than in the first doping treatment and at a high acceleration voltage. For example, the acceleration voltage is set to 70 to 120 keV and the dose is set to $1\times10^{13}$ atoms/cm$^2$ to form new impurity regions inside the first impurity regions that are formed in the island-like semiconductor layers in FIG. 5B. While the second conductive layers 5017b to 5020b are used as masks against the impurity element, regions under the first conductive layers 5017a to 5020a are also doped with the impurity element. Thus formed are second impurity regions 5021 to 5023 overlapping the first conductive layer.

Figure 6A:
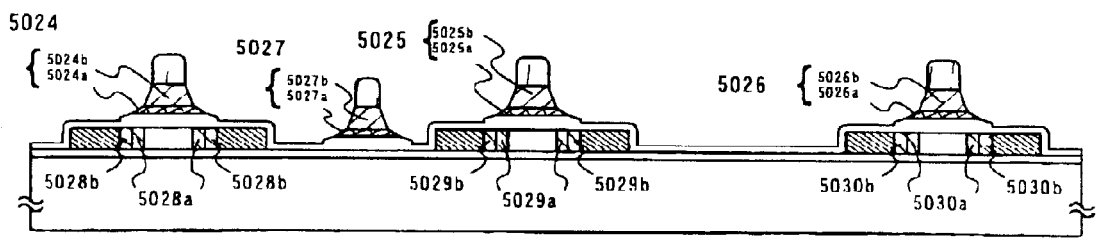
FIGS. 6A to 6C are views showing manufacturing steps of a semiconductor device.

Next, as shown in FIG. 6A, a third etching process is performed. In this embodiment, an ICP etching device is employed and $Cl_2$ is used as etching gas. Etching is conducted for 70 seconds, setting the flow rate of $Cl_2$ to 60 sccm, and an RF power of 350 W is applied to a coil type electrode under a pressure of 1 Pa to generate plasma. An RF power is also applied to the side of the substrate (sample stage) so that a substantially negative self-bias voltage is applied. Through the third etching process, the first conductive layer is etched to reduce the region, thereby third shape conductive layers 5024 to 5027 (first conductive layers 5024a to 5027a and second conductive layers 5024b to 5027b) are formed. The second impurity regions 5021 to 5023 include the second impurity regions 5028a to 5030a overlapping the first conductive layer and the third impurity region 5028b to 5030b that are not covered with the first conductive layer.

Through the steps above, the impurity regions are formed in the respective island-like semiconductor layers. The third shape conductive layers 5024 to 5026 overlapping the island-like semiconductor layers function as gate electrodes of TFTs. The third shape conductive layer 5027 function as source signal lines.

The impurity elements used to dope the island-like semiconductor layers in order to control the conductivity types are activated. The activation step is carried out by thermal annealing using an annealing furnace. Other activation adoptable methods include laser annealing and rapid thermal annealing (RTA). The thermal annealing is conducted in a nitrogen atmosphere with an oxygen concentration of 1 ppm or less, preferably 0.1 ppm or less, at 400 to 700° C., typically 500 to 600° C. In this embodiment, the substrate is subjected to heat treatment at 500° C. for four hours. However, if the wiring line material used for the third shape conductive layers 5024 to 5027 are weak against heat, the activation is desirably made after an interlayer insulating film (mainly containing silicon) is formed in order to protect the wiring lines and others.

Another heat treatment is conducted in an atmosphere containing 3 to 100% hydrogen at 300 to 450° C. for one to twelve hours, thereby hydrogenating the island-like semiconductor layers. The hydrogenation steps are to terminate dangling bonds in the semiconductor layers using thermally excited hydrogen. Alternatively, plasma hydrogenation (using hydrogen that is excited by plasma) may be employed.

Figure 6B:
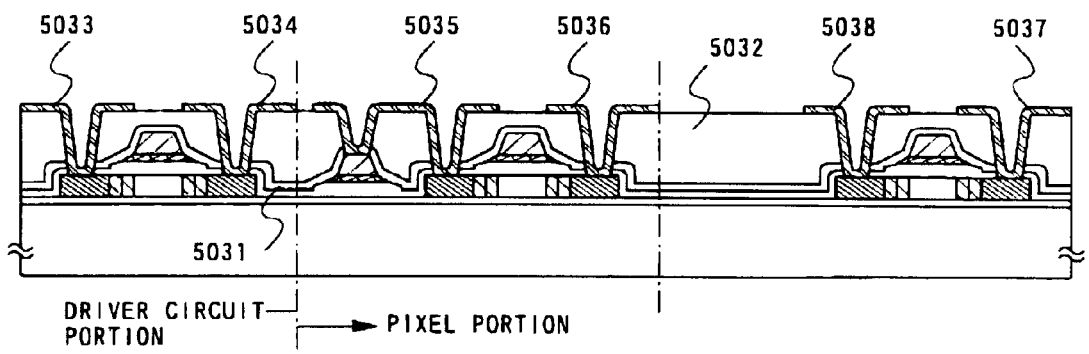

As shown in FIG. 6B, a first interlayer insulating film 5031 is formed next from a silicon oxynitride film with a thickness of 100 to 200 nm. A second interlayer insulating film 5032 is formed thereon from an organic insulating material. Thereafter, contact holes are formed corresponding to the first interlayer insulating film 5031, the second interlayer insulating film 5032, and the gate insulating film 5006. A film made of wiring lines material is formed, whereby connection wiring lines 5033 to 5037 and a connection electrode 5038 are formed by patterning.

The second interlayer insulating film 5032 is a film made of an organic resin. Examples of the usable organic resin includes polyimide, polyamide, acrylic resin, and BCB (benzocyclobutene). Since planarization is a significant aspect of the role of the second interlayer insulating film 5032, acrylic resin that can level the surface well is particularly preferable. In this embodiment, the acrylic film is thick enough to eliminate the level differences caused by the transistors. An appropriate thickness of the film is 1 to 5 µm (preferably 2 to 4 µm).

The contact holes are formed by dry etching or wet etching, and include contact holes reaching the impurity regions 5014 to 5016 having the n-type conductivity, the source signal lines 5027, the gate signal lines (not shown), a power supply line (not shown), and gate electrodes 5024 to 5026 (not shown) respectively.

Further, a lamination film of a three layer structure, in which a 100 nm thick Ti film, a 300 nm thick Al film containing Ti, and a 150 nm thick Ti film are formed in succession by sputtering wirings 5033 to 5038. Of course, other conductive materials may be used.

Figure 6C:
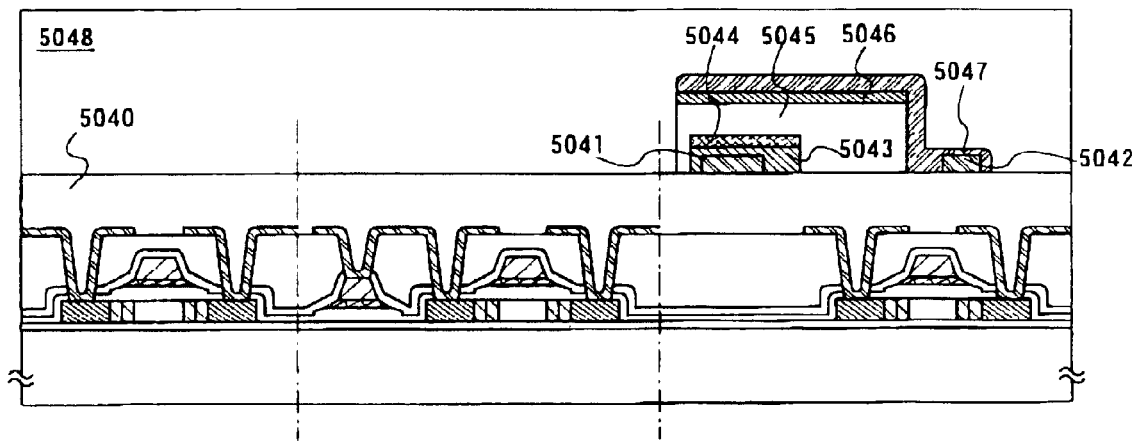

Next, as shown in FIG. 6C, an insulating film containing organic material such as acrylic resin is formed to a thickness of 1 to 3 µm, thereby the third interlayer insulating film 5040 is formed.

A three lamination layers which are laminated by 100 nm thick Ti film, 300 thick Al film containing Ti film and 150 nm thick containing Ti film formed continuously by sputtering method is patterned in desired shape to form a wiring 5041 and a wiring 5042. Other conductive materials can be used. In addition, wirings 501 and 5042 are connected to a source region or a drain region of a transistor formed in a pixel 100.

A metal film is formed in 100 to 500 nm thick to contact the wiring 5041. Known conductive materials of ITO film are used to form the metal film. Next, the first microcrystal semiconductor film is formed to contact the metal film in 25 to 80 nm thick.

The impurity elements that give a p-type conductivity is added to the first microcrystal semiconductor film by using a known method. The metal film and the first microcrystal semiconductor film are patterned to overlap with the wiring 5041, thus, the metal layer 5043 and the microcrystal semiconductor layer (p-type semiconductor layer) 5044 are formed simultaneously.

Adding the p-type impurity elements is conducted by mix the doping gas including p-type impurity elements when the first microcrystal semiconductor layer is formed. Further, the p-type impurity elements can be added to only the microcrystal semiconductor layer 5044 after patterning the metal layer and the first microcrystal semiconductor layer.

An amorphous semiconductor film is formed in 10 to 200 nm thick to overlap the microcrystal semiconductor layer (p-type semiconductor layer) 5044. Subsequently, the second microcrystal semiconductor film is formed in 25 to 80 thick on the amorphous semiconductor film. The manufacturing method thereof is not particularly limited. Any known materials can be used to form the amorphous semiconductor film and the second microcrystal semiconductor film.

Next, the n-type impurity elements can be added to the second microcrystal semiconductor film by using a known method. The amorphous semiconductor layer and the second microcrystal semiconductor layer are patterned in desired shape to overlap the p-type semiconductor layer 5044. Thus, the amorphous semiconductor layer (photoelectric conversion layer) 5045 and the microcrystal semiconductor layer (n-type semiconductor layer) 5046 are simultaneously formed.

Adding the n-type impurity elements is conducted by mix the doping gas including n-type impurity elements when the microcrystal semiconductor layer is formed. Otherwise, the n-type impurity elements can be added to only the microcrystal semiconductor layer 5046 after patterning the metal layer and the microcrystal semiconductor layer.

The photoelectric conversion element 111 corresponds to the laminated constitution of the p-type semiconductor layer 5044, the photoelectric conversion layer 5045, and the n-type semiconductor layer 5046. The metal film is formed in 20 to 100 nm thick using a conductive material to overlap the n-type semiconductor layer 5046 and the wiring 5042. The metal layer 5047 is formed to connect electrically the microcrystal semiconductor layer 5046 of the photoelectric conversion element 111 and to the wiring 5042 by patterning the metal film to form in desired shape.

Subsequently, the fourth interlayer insulating film 5048 made of an organic resin film is formed. The fourth interlayer insulating film 5048 has a function of insulation of wiring materials, moreover, flatness of the surface. Any kinds of known materials can be used for the fourth interlayer insulating film. However, the fourth interlayer insulating film is formed as an organic resin film by using acryl as materials in 50 to 300 nm μm thick.

The present invention having an above structure can provide a semiconductor device, which realizes the improvement of yield and reduction of a manufacturing cost by forming a single polarity (same conductivity type) transistor pixel thereby reducing manufacturing steps.

This embodiment can be freely combined with Embodiment Modes and Embodiment 1.

[Embodiment 3]

In this embodiment, a manufacturing steps of the pixel portion in which the photoelectric conversion element, the light emitting element, and transistor are provided on the same insulating surface, and the driver circuit in the periphery of the pixel portion by using a single polarity transistor are described with references to FIGS. 9A to 10B.

As above mentioned in Embodiment 2, the manufacturing method of the pixel portion and driver circuit of the periphery thereof formed by only n-channel type transistors are described. In the n-channel type transistor, the impurity region referred to as an overlap region is provided at the region overlapped with the gate electrode to restrain the hot carrier deterioration. On the contrary, in the p-channel type transistor, the overlap region is not necessary to be formed, because the influence of the p-channel type transistor due to the hot career deterioration is small. The p-channel type transistor can be formed by more simple steps.

Figure 9A:
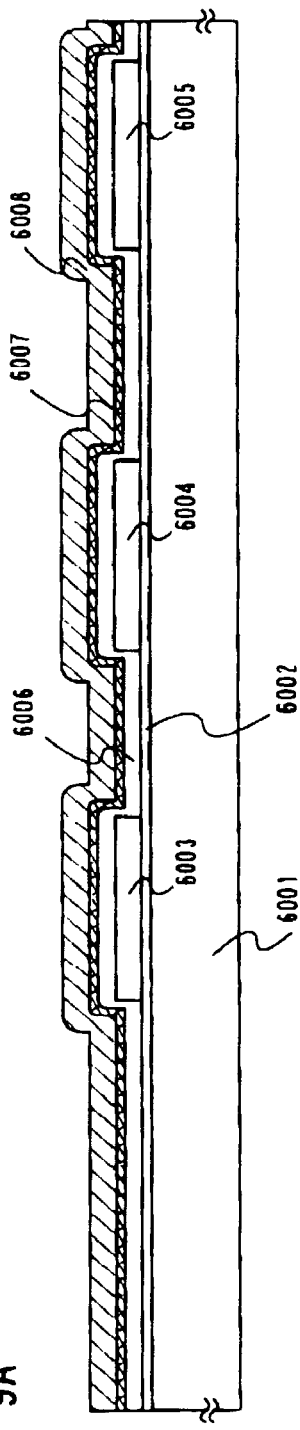
FIGS. 9A to 9C are views showing manufacturing steps of a semiconductor device.

As shown in FIG. 9A, the a base film 6002 is formed on the insulating substrate 6001 such as glass and island semiconductor layers 6003 to 6005, a gate insulating film 6006, and conductive layers 6007 and 6008 are formed thereon successively. The conductive layers 6007 and 6008 are lamination structure here, however, it can also be a single layer. Further, a detail explanation is omitted here, because this step is based on Embodiment 2.

Figure 9B:
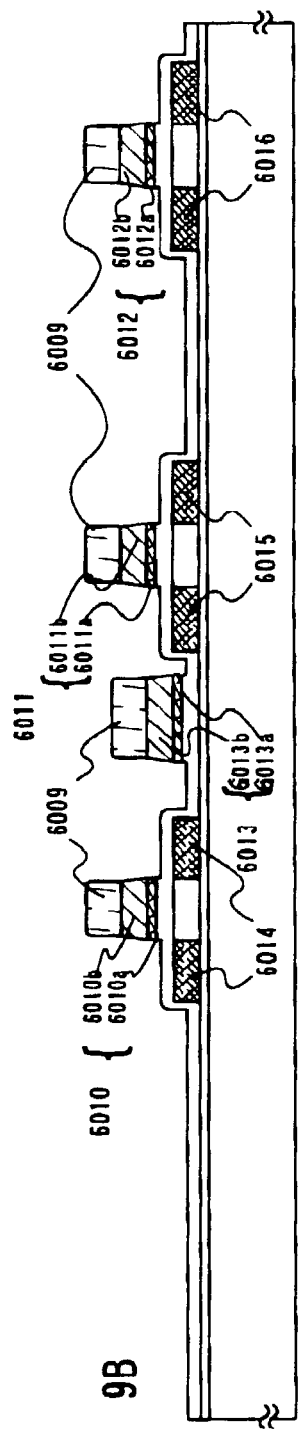

Next, as shown in FIG. 9B, a mask 6009 made from resist is formed and the first etching treatment is conducted. An anisotropic etching is conducted by utilizing a selection rate of conductive layer material that is a lamination structure in Embodiment 2. However, an ordinary etching treatment is conducted here, because there is no need to provide an overlapping region. In the gate insulating film 6006, a region where become thin 20 to 50 nm by etching treatment is formed.

The first doping treatment is conducted to add p-type impurity elements to the island semiconductor layer. The impurity region is formed in a self-alignment manner using conductive layers 6010 to 6012 as a mask for impurity elements. Boron (B) is typical elements as a p-type impurity element. In this embodiment, ion doping method using diborane ($B_2H_6$) is used and the impurity concentration of the semiconductor layer is set to $2\times10^{20}$ to $2\times10^{21}$ atms/cm$^3$.

After removing a mask made from resist, the first interlayer insulating film 6022 is a film made of an organic resin. Examples of the usable organic resin includes polyimide, polyamide, acrylic resin, and BCB (benzocyclobutene). Since planarization is a significant aspect of the role of the first interlayer insulating film 6022, acrylic resin that can level the surface well is particularly preferable. In this embodiment, the acrylic film is thick enough to eliminate the level differences caused by the transistors. An appropriate thickness of the film is 1 to 5 μm (preferably 2 to 4 μm).

The contact holes that is reaching the p-type impurity regions 6014 to 6016 are formed by dry etching or wet etching.

Figure 9C:
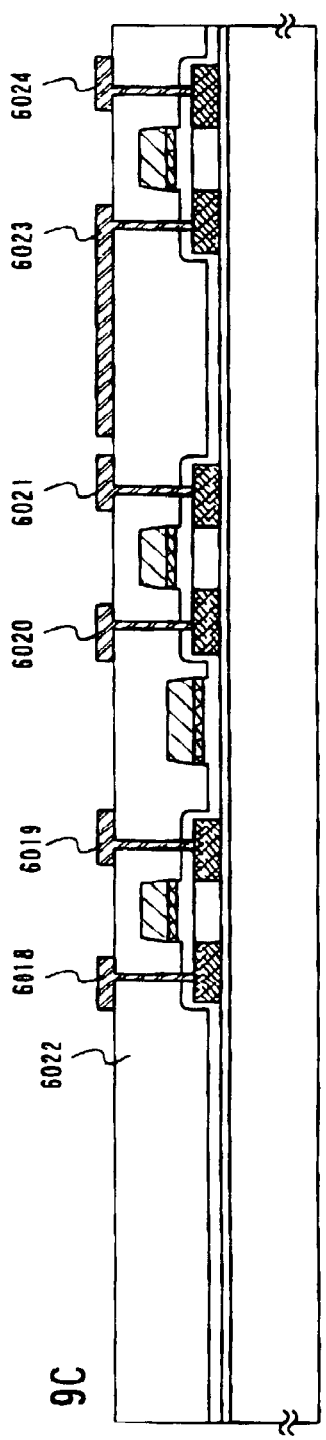

A lamination film of a three layer structure, in which a 100 nm thick Ti film, a 300 nm thick Al film containing Ti, and a 150 nm thick Ti film are formed in succession by sputtering as the wirings 6018 to 6021, 6023 and 6024 (FIG. 9C). Next, the second interlayer insulating film 6025 is formed out of an oxynitride silicon film in 100 to 200 nm thick to overlap the wirings 6018 to 6021, 6023 and 6024 and the first interlayer insulating film 6022.

Further, a lamination film of a three layer structure, in which a 100 nm thick Ti film, a 300 nm thick Al film containing Ti, and a 150 nm thick Ti film are formed in succession by sputtering the wirings 6041 and 6042. Of course, the present invention is not limited to this, other conductive materials may be used. Subsequently, a metal film is formed in order to contact to the wiring 6041 in 100 to 500 nm thick. The metal film is formed by using known conductive materials such as ITO film. The first microcrystal semiconductor film is formed in order to contact to the metal film by using known method in 25 to 80 nm thick.

The impurity elements that give a p-type conductivity is added to the first microcrystal semiconductor film by using a known method. The metal film and the first microcrystal semiconductor film are patterned to overlap with the wiring 6041, thus, the metal layer 6043 and the microcrystal semiconductor layer (p-type semiconductor layer) 6044 are formed at the same time.

Adding the p-type impurity elements is conducted by mix the doping gas including p-type impurity elements when the first microcrystal semiconductor layer is formed. Further, the p-type impurity elements can be added to only the microcrystal semiconductor layer 6044 after patterning the metal layer and the first microcrystal semiconductor layer.

An amorphous semiconductor film is formed in 10 to 200 nm thick to overlap the microcrystal semiconductor layer (p-type semiconductor layer) 6044. Subsequently, the second microcrystal semiconductor film is formed in 25 to 80 thick on the amorphous semiconductor film. The manufacturing method thereof is not particularly limited. Any known materials can be used to form the amorphous semiconductor film and the second microcrystal semiconductor film.

Next, the n-type impurity elements can be added to the second microcrystal semiconductor film by using a known method. The amorphous semiconductor layer and the second microcrystal semiconductor layer are patterned in desired shape to overlap the p-type semiconductor layer 6043. Thus, the amorphous semiconductor layer (photoelectric conversion layer) 6045 and the microcrystal semiconductor layer (n-type semiconductor layer) 6046 are formed at the same time.

Figure 10A:
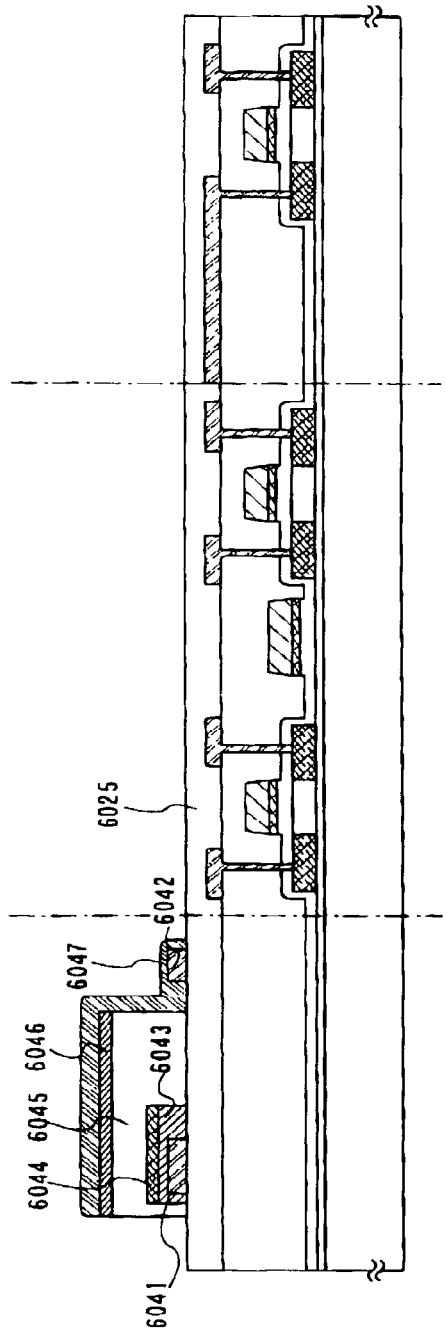
FIGS. 10A and 10B are views showing manufacturing steps of a semiconductor device.

Adding the n-type impurity elements is conducted by mix the doping gas including n-type impurity elements when the microcrystal semiconductor layer is formed. Otherwise, the n-type impurity elements can be added to only the microcrystal semiconductor layer 6046 after patterning the metal layer and the microcrystal semiconductor layer (FIG. 10A).

The photoelectric conversion element 111 corresponds to the laminated constitution of the p-type semiconductor layer 6044, the photoelectric conversion layer 6045, and the n-type semiconductor layer 6046. The metal film is formed in 20 to 100 nm thick using a conductive material to overlap the second interlayer insulating film 6025, the n-type semiconductor layer 6046 and the wiring 6042. The metal layer 6047 is formed to connect electrically the microcrystal semiconductor layer 6046 of the photoelectric conversion element 111 and to the wiring 6042 by patterning the metal film to form in desired shape.

Subsequently, the fourth interlayer insulating film 6048 made of an organic resin film is formed. The fourth interlayer insulating film 6048 has a function of insulation of wiring materials, moreover, flatness of the surface. Any kinds of known materials can be used for the fourth interlayer insulating film. However, the fourth interlayer insulating film is formed as an organic resin film by using acryl as materials in 50 to 300 nm μm thick.

The aperture is formed on the second interlayer insulating film 6025 and the third interlayer insulating film 6048 to expose the source wiring or the drain wiring of the driver transistor. When forming the aperture, the tapered shape side-wall can be easily obtained by using a wet etching treatment. If the side walls of the aperture is not smooth enough, the level difference can make degradation and stepping of an organic compound layer into a serious problem. After forming the aperture, the pixel electrode (transparent electrode) 6049 and the organic compound layer 6050 are formed by vacuum evaporation successively. The cathode 6051 made from MgAg is formed in order to overlap the organic compound layer 6050. The thickness of the pixel electrode 6049 and the cathode 6051 is set to 80 to 200 nm (typically 100 to 120 nm). The thickness of the organic compound layer 6050 is set to 80 to 200 nm (typically 100 to 120 nm).

In this step, the organic compound layer 6050 and the cathode 6051 are formed in a pixel for red light, then in a pixel for green light, and then in a pixel for blue light. The organic compound layer 6050 has low resistivity to solutions, inhibiting the use of photholithography. Therefore, each cooler should be formed individually without using photolithography. Then, it is preferable that only the necessary portion is formed covering the portion except for desired one by a metal mask and the like.

Formed here are three types of light emitting elements in accordance with R, G, and B. Instead, a white light emitting light emitting element combined with color filters, a blue light or bluish green light emitting element combined with fluorophors (fluorescent color conversion layers: CCM) may be used. Note that a known material can be used for the organic compound layer 6050. A preferable known material is an organic material, taking the driving voltage into consideration.

Then, a protective film 6052 is formed from a silicon nitride film with a thickness of 50 to 300 nm. The protective film 6052 protects the organic compound layer 6050 from moisture and the like.

Figure 10B:
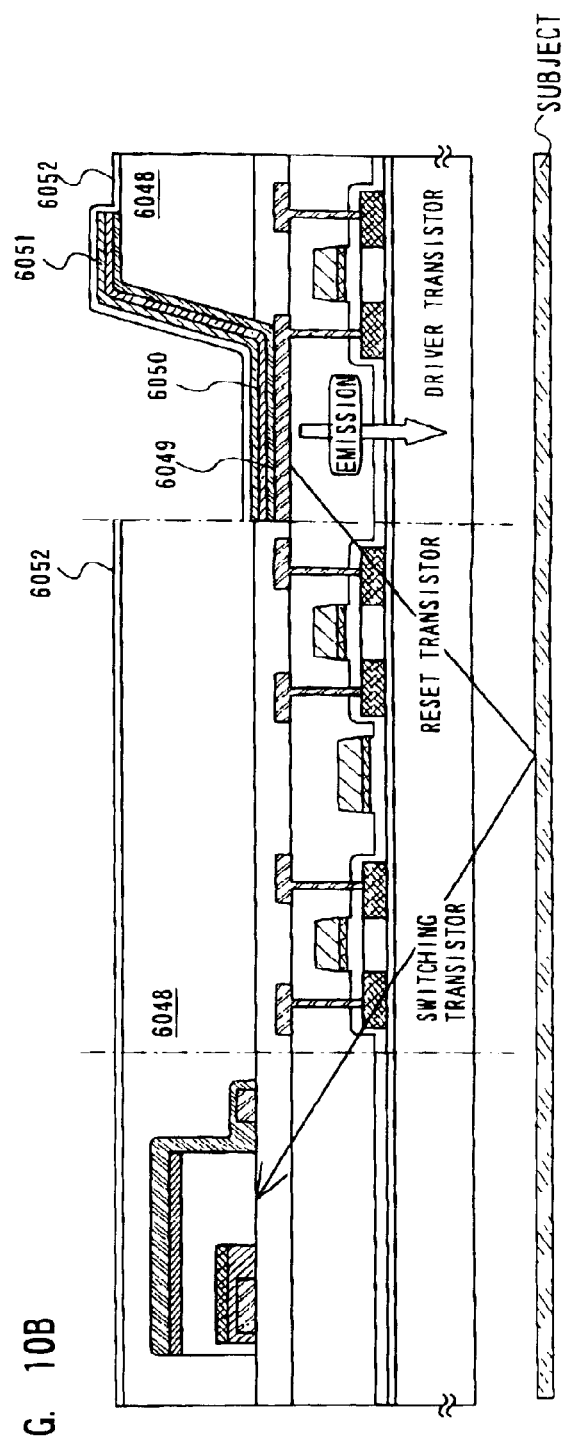
Figure 11A:
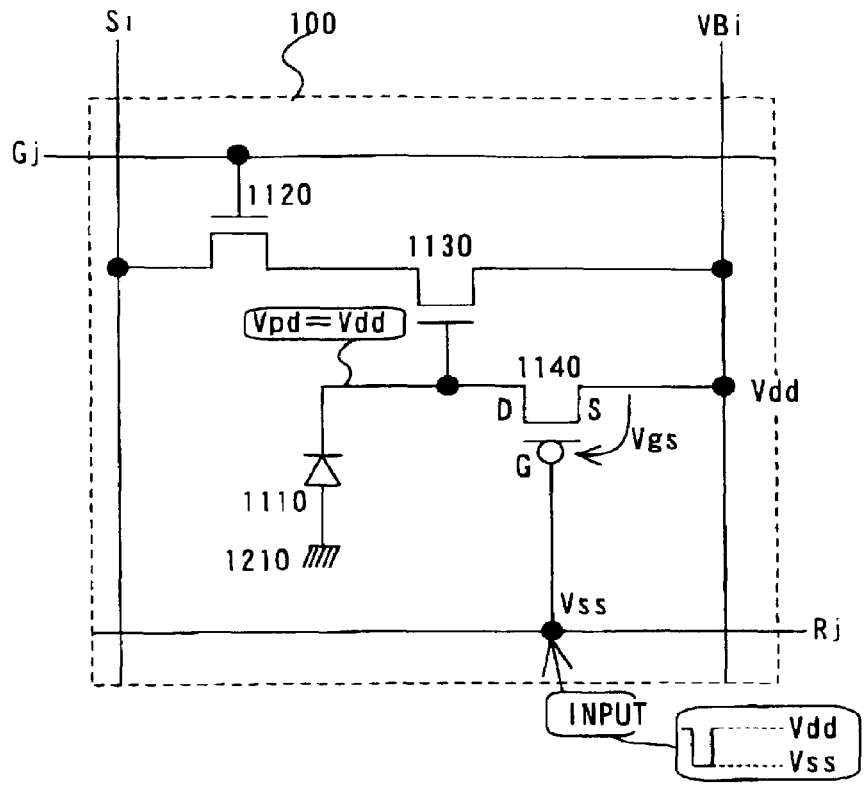
FIGS. 11A and 11B are circuit diagrams showing a pixel in a semiconductor device.
Figure 11B:
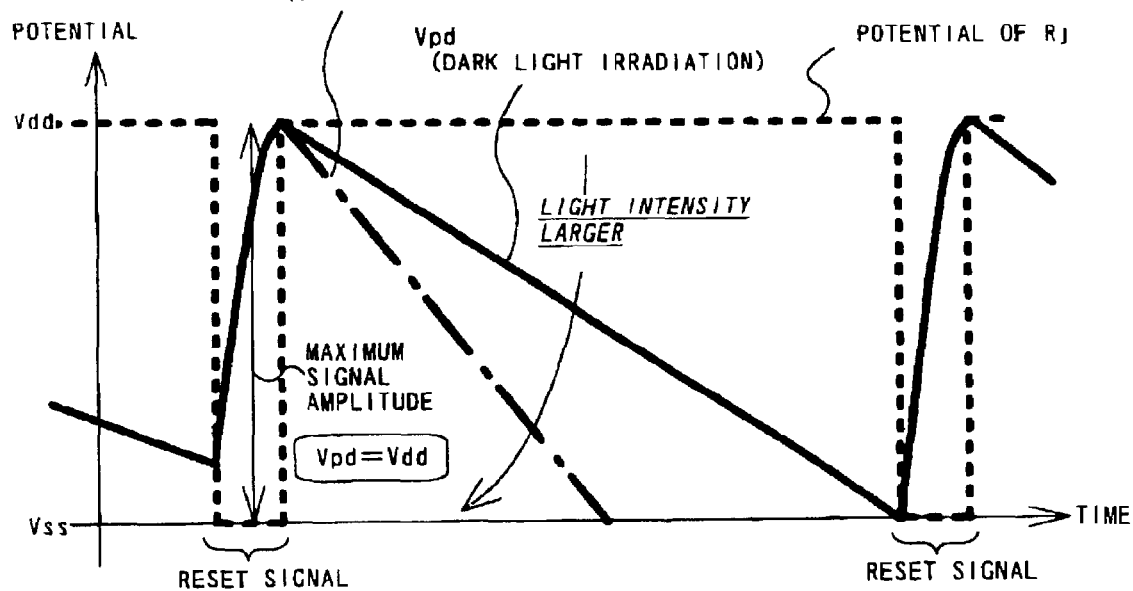
Figure 12A:
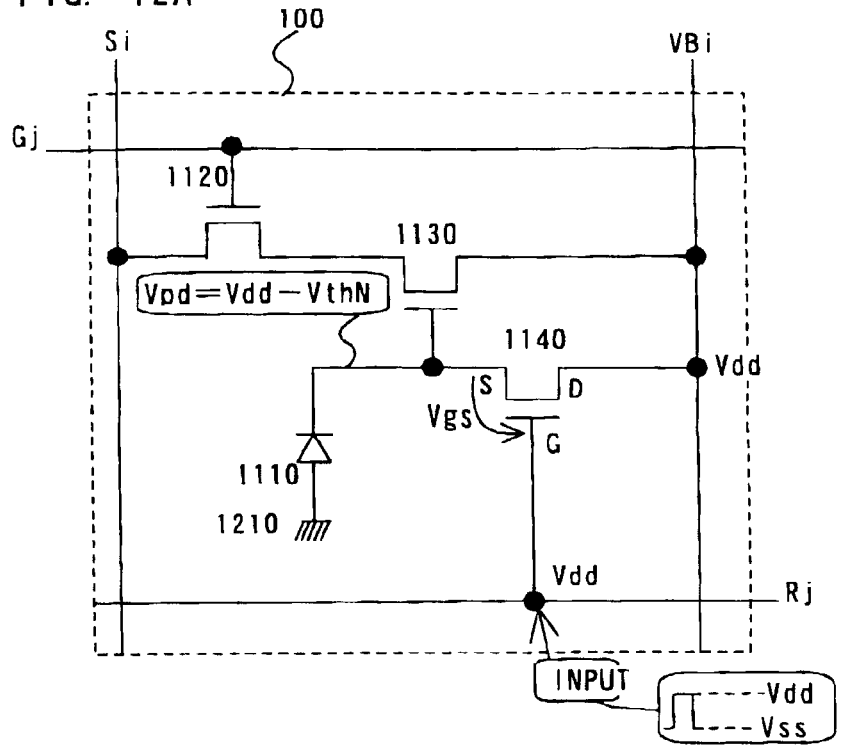
FIGS. 12A and 12B are circuit diagrams showing a pixel in a semiconductor device.
Figure 12B:
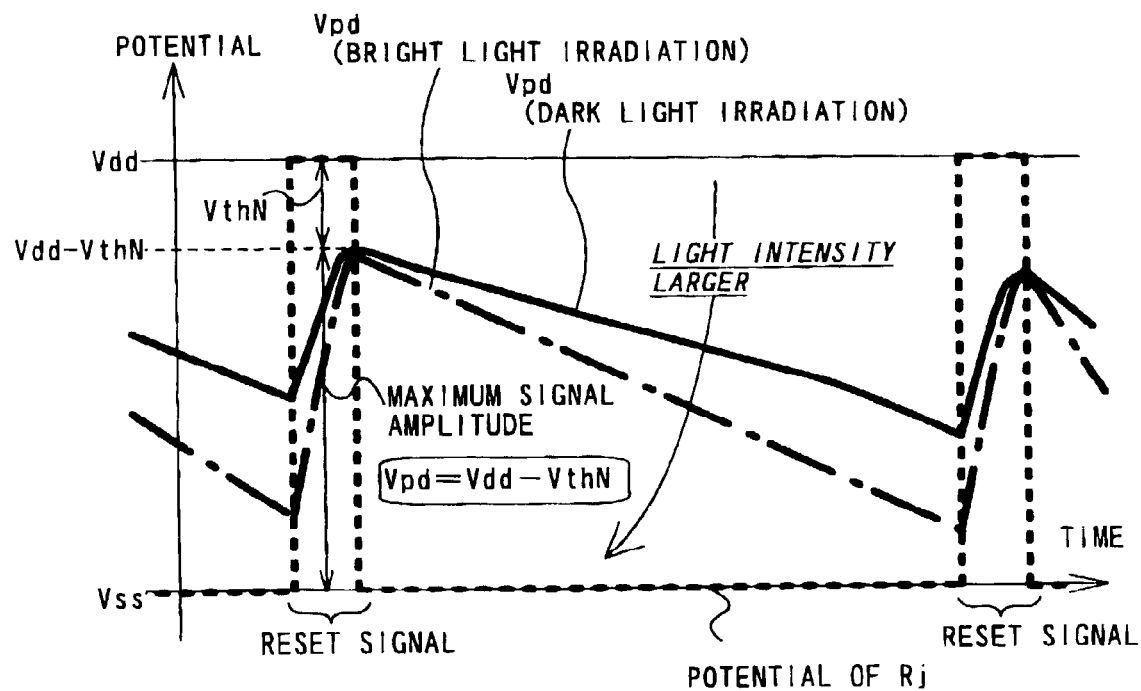

In practice, the device reaching the state of FIG. 10B is packaged (enclosed) using a protective film that is highly airtight and allows little gas to transmit (such as a laminate film and a UV-curable resin film) or a light-transmissive seal, so as to further avoid exposure to the outside air. A space inside the seal may be set to an inert atmosphere or a hygroscopic substance (barium oxide, for example) may be placed there to improve the reliability of the light emitting element.

After securing the air tightness through packaging or other processing, a connector (flexible printed circuit: FPC) is attached for connecting an external signal terminal with a terminal led out from the elements or circuits formed on the substrate. The device in a state that can be shipped is called display device in this specification.

According to the structure of this embodiment, the light emitted from the light emitting element is emitted to the side of the substrate 6001 on which a transistor is formed. The light emitted from the light emitting element is irradiated to a subject, and the light reflected to the subject is irradiated to the light conversion element.

The light emitted from the light emitting element are emitted to the direction of the substrate 6001 and to the opposite direction to the substrate 6001. The former is referred to as bottom emission type and the latter is referred to as top emission type. In the case of the bottom emission type, the pixel electrode 6049 is corresponded to an anode and the opposite electrode 6051 is corresponded to a cathode. In the case of the top emission type, the pixel electrode 6049 is corresponded to a cathode and the opposite electrode 6051 is corresponded to an anode. In this embodiment, only the bottom emission type that light is emitted to the substrate 6001 is shown, however, the present invention is not limited to this. The top emission type may be executed that light is emitted to the opposite direction to the substrate 6001. In the case of the top emission type, the almost light emitted from the light emitting element can be derived to the outside in independence of an aperture ratio of the pixel. Thus, it is effective in the case that many circuit elements are provided in the pixel.

According to the present invention configured as described above, it is possible to provide a semiconductor device in which the number of manufacturing steps is reduced by using transistors having a single polarity (i.e. having the same conductivity type), thereby achieving increased yield and reduced costs. In addition, the present invention can provide the semiconductor device that the photoelectric conversion element can obtain enough signal amplitude. Also, by the present invention, it is possible to provide a semiconductor device in which the photoelectric conversion element can read out a subject with higher precision.

This embodiment can be freely combined with Embodiment Mode, Embodiments 1 and 2.

[Embodiment 4]

Examples of electronic equipment using a semiconductor device of the present invention are described with reference to FIGS. 13A to 13G.

Figure 13A:
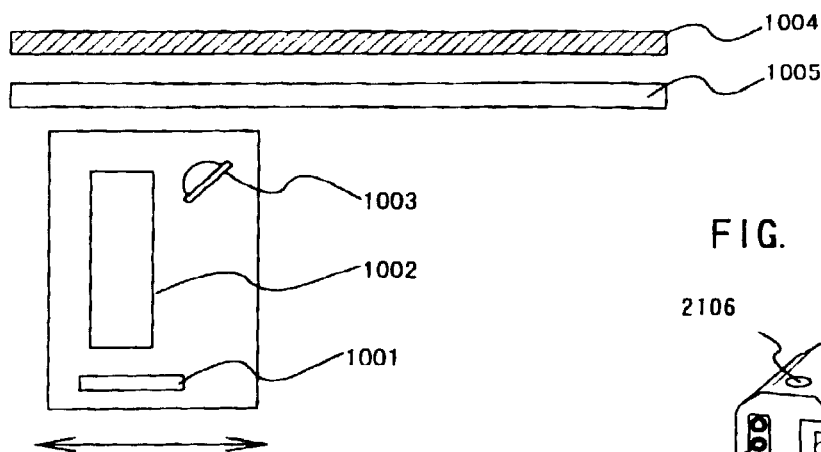
FIGS. 13A to 13G are views showing examples of electronic appliances to which the present invention is applied.

FIG. 13A shows a hand scanner using a line sensor. An optical system 1002 such as a rod lens array is provided above a CCD type (CMOS type) image sensor 1001. The optical system 1002 is used to project an image of a subject 1004 onto the image sensor 1001. A light source 1003 such as an LED or fluorescent is positioned so as to irradiate the subject 1004 with light. Glass 1005 is placed under the subject 1004.

Light emitted from the light source 1003 enters the subject 1004 through the glass 1005. The light reflected by the subject 1004 enters the optical system 1002 through the glass 1005. After entering the optical system 1002, the light enters the image sensor 1001 to be subjected to photoelectric conversion in there. The semiconductor device of the present invention can be used to the image sensor 1001.

Figure 13B:
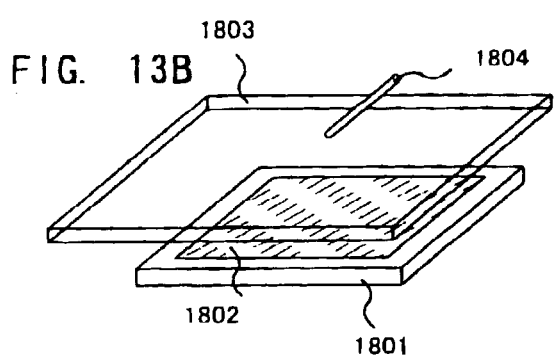

In FIG. 13B, 1801 denotes a substrate; 1802, a pixel portion; 1803, a touch panel; and 1804, a touch pen. The touch panel 1803 is light-transmissive and transmits light emitted from the pixel portion 1802 as well as light entering the pixel portion 1802. The device thus can read an image of a subject through the touch panel 1803. An image on the pixel portion 1802 can be seen through the touch panel 1803 while the pixel portion 1802 is displaying an image.

When the touch pen 1804 comes into contact with the touch panel 1803, the positional information of the point where the touch pen 1804 is in contact with the touch panel 1803 can be sent as an electric signal to the semiconductor device. Any known touch panel and touch pen may be used as the touch panel 1803 and the touch pen 1804 of this embodiment as long as the touch panel is light-transmissive and the positional information of the point where the touch pen is in contact with the touch panel is sent as an electric signal to the semiconductor device. The semiconductor device of the present invention can be used to the pixel portion 1802.

Figure 13C:
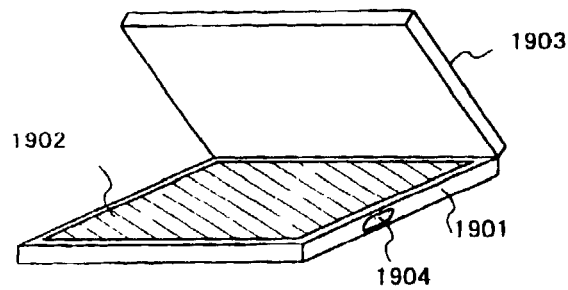
Figure 13D:
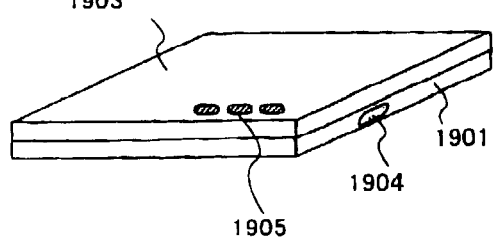

FIG. 13C shows a portable hand scanner different from the one in FIG. 13B. The scanner in FIG. 13C is composed of a main body 1901, a pixel portion 1902, a top cover 1903, an external connection port 1904, and operation switches 1905. FIG. 13D shows the same portable hand scanner as the one in FIG. 13C with the top cover 1903 closed.

In the semiconductor device shown in FIGS. 13C and 13D, an image signal read by the pixel portion 1902 may be sent to electronic equipment externally connected to the portable hand scanner through the external connection port 1904. Then the data can be processed in a personal computer to correct, synthesize, or edit the image. The semiconductor device of the present invention can be used to the pixel portion 1902.

Given as examples of an electric appliance that employs the semiconductor device of present invention are video cameras, digital cameras, lap-top computers, portable information terminals (such as mobile computers, cellular phones, portable game machines, and electronic books).

Figure 13E:
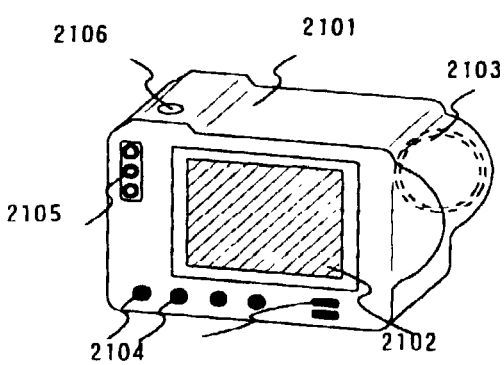

FIG. 13E shows a digital still camera, which is composed of a main body 2101, a display portion 2102, an image receiving unit 2103, operation keys 2104, an external connection port 2105, a shutter 2106, etc. The semiconductor device of the present invention can be applied to the display portion 2102.

Figure 13F:
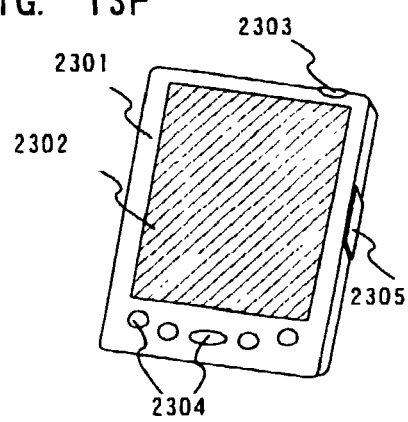

FIG. 13F shows a mobile computer, which is composed of a main body 2301, a display portion 2302, a switch 2303, operation keys 2304, an infrared port 2305, etc. The semiconductor device of the present invention can be applied to the display unit 2302.

Figure 13G:
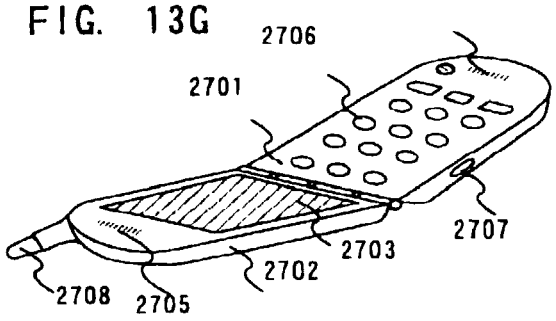
Figure 14A:
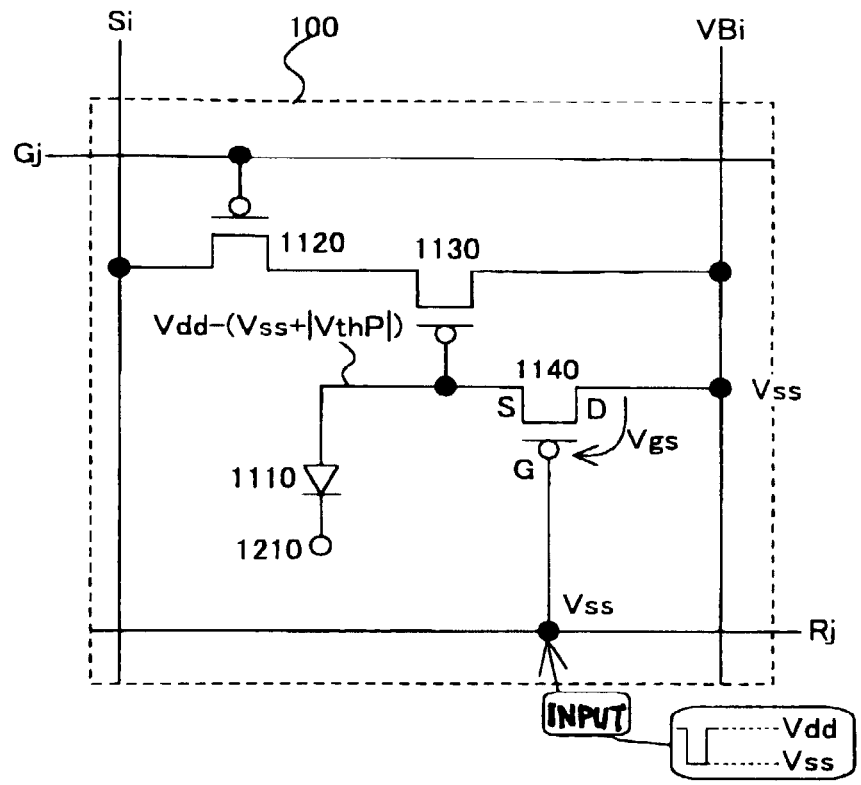
FIGS. 14A and 14B are circuit diagrams showing a pixel in a semiconductor device.
Figure 14B:
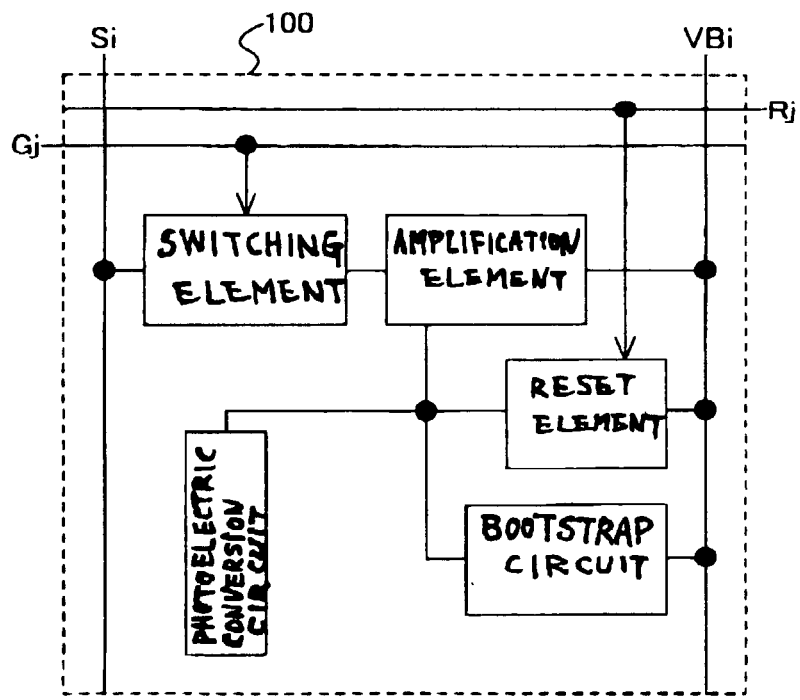

FIG. 13G shows a cellular phone, which is composed of a main body 2701, a case 2702, a display portion 2703, an audio input portion 2704, an audio output portion 2705, operation keys 2706, an external connection port 2707, an antenna 2708, etc. The semiconductor device of the present invention can be applied to the display unit 2703.

As described above, the application range of the present invention is so wide that it is applicable to electric appliances of any field.

According to the present invention configured as described above, it is possible to provide a semiconductor device in which the number of manufacturing steps is reduced by using transistors having a single polarity (i.e. having the same conductivity type), thereby achieving increased yield and reduced costs.

Also, in the present invention, it is possible to provide a semiconductor device in which a photoelectric conversion element thereof can attain a sufficient signal amplitude by using a bootstrap method, whereby the photoelectric conversion element can read out a subject with higher precision.

What is claimed is:

1. A semiconductor device having a plurality of pixels, each of the pixels comprising:
   a switching transistor;
   an amplification transistor electrically connected to the switching transistor;
   a reset transistor electrically connected to a gate electrode of the amplification transistor;
   a boot transistor electrically connected to a gate electrode of the reset transistor;
   a discharge transistor electrically connected to the gate electrode of the amplification transistor; and
   a photoelectric conversion element electrically connected to the gate electrode of the amplification transistor;
   wherein transistors included in the each of the pixels have the same conductivity type.

2. A device according to claim 1, wherein the transistors included in the each of the pixels are n-channel type.

3. A device according to claim 1, wherein the transistors included in the each of the pixels are n-channel type.

4. A device according to claim 1, wherein the semiconductor device is an electric device having a hand scanner.

5. A device according to claim 1, wherein the semiconductor device is an electric device selected from the group consisting of a video camera, a digital camera, a lap-top computer, a portable information terminal, a mobile computer, a cellular phone, a portable game machine, and an electronic book.

6. A semiconductor device having a plurality of pixels, each of the pixels comprising:
   a plurality of transistors;
   a photoelectric conversion element having two electrodes;
   power source supply means;
   a bootstrap circuit for setting a potential difference between the both electrodes of the photoelectric conversion element to the same potential as the power source supply means; and
   a light emitting element, wherein light emitted from the light emitting element is irradiated onto a subject and light reflected by the subject is irradiated onto the photoelectric conversion element, and wherein transistors included in each of the pixels have the same conductivity type.

7. A device according to claim 6, wherein the transistors included in the each of the pixels are n-channel type.

8. A device according to claim 6, wherein the transistors included in the each of the pixels are p-channel type.

9. A device according to claim 6, wherein the plurality of transistors comprise at least a switching transistor, an amplification transistor, and a reset transistor.

10. A device according to claim 6, wherein the semiconductor device is an electric device having a band scanner.

11. A device according to claim 6, wherein the semiconductor device is an electric device selected from the group consisting of a video camera, a digital camera, a lap-top computer, a portable information terminal, a mobile computer, a cellular phone, a portable game machine, and an electronic book.

12. A semiconductor device having a plurality of pixels, each of the pixels comprising:
a switching transistor;
an amplification transistor electrically connected to the switching transistor;
a reset transistor electrically connected to a gate electrode of the amplification transistor;
a boot transistor electrically connected to a gate electrode of the reset transistor;
a capacitor electrically connected to the gate electrode of the amplification transistor and the gate electrode of the reset transistor;
a discharge transistor electrically connected to the gate electrode of the amplification transistor; and
a photoelectric conversion element electrically connected to the gate electrode of the amplification transistor;
wherein the transistors included in each of the pixels have the same conductivity type.

13. A device according to claim 12, wherein the transistors included in the each of the pixels are n-channel type.

14. A device according to claim 12, wherein the transistors included in the each of the pixels are n-channel type.

15. A device according to claim 12, wherein the gate electrode of the reset transistor is set to a potential higher than that of a power source supply means due to capacitive coupling by the capacitor.

16. A device according to claim 12, wherein the semiconductor device is an electric device having a hand scanner.

17. A device according to claim 12, wherein the semiconductor device is an electric device selected from the group consisting of a video camera, a digital camera, a lap-top computer, a portable information terminal, a mobile computer, a cellular phone, a portable game machine, and an electronic book.

18. A semiconductor device having a plurality of pixels, each of the pixels comprising:
a plurality of transistors;
a photoelectric conversion element having two electrodes;
power source supply means;
a bootstrap circuit; and
a light emitting element,
wherein the bootstrap circuit comprises:
a discharge transistor for setting the both electrodes of the photoelectric conversion element to the same potential;
a boot transistor which has a gate electrode, a first electrode, and a second electrode and which is turned off wherein a signal is inputted to the lust electrode, the gate electrode being connected to the power source supply means; and
a capacitor arranged between the photoelectric conversion element and the second electrode of the boot transistor,
wherein light emitted from the light emitting element is irradiated onto a subject and light reflected by the subject is irradiated onto the photoelectric conversion element, and
wherein the transistors included in each of the pixels have the same conductivity type.

19. A device according to claim 18, wherein the transistors included in the each of the pixels are n-channel type.

20. A device according to claim 18, wherein the transistors included in the each of the pixels are p-channel type.

21. A device according to claim 18, wherein the plurality of transistors comprise at least a switching transistor, an amplification transistor and a reset transistor.

22. A device according to claim 21, wherein the reset transistor has a gate electrode that is set to a potential higher than that of the power source supply means due to capacitive coupling by the capacitor.

23. A device according to claim 18, wherein the semiconductor device is an electric device having a hand scanner.

24. A device according to claim 18, wherein the semiconductor device is an electric device selected from the group consisting of a video camera, a digital camera, a lap-top computer, a portable information terminal, a mobile computer, a cellular phone, a portable game machine, and an electronic hook.

25. A semiconductor device having a plurality of pixels, each of the pixels comprising:
a plurality of transistors comprising at least a switching transistor, an amplification transistor, and a reset transistor;
a photoelectric conversion element having first and second terminals;
power source supply means;
a bootstrap circuit;
a discharge signal line: and
a reset signal line,
wherein the bootstrap circuit comprises:
a discharge transistor and a boot transistor, each having a gate electrode, a source region, and a drain region; and
a capacitor having first and second terminals;
wherein the gate electrode of the discharge transistor is connected to the discharge signal line,
wherein one of the source region and the drain region of the discharge transistor is connected to the first terminal of the photoelectric conversion element, and the other is grounded,
wherein the gate electrode of the boot transistor is connected to the power source supply means,
wherein one of the source region and the drain region of the boot transistor is connected to the reset signal line, and the other is connected to the gate electrode of the reset transistor and to the first terminal of the capacitor,
wherein a gate electrode of the reset transistor is connected to the first terminal of the capacitor,
wherein one of a source region and a drain region of the reset transistor is connected to the power source supply means, and the other is connected to the second terminal of the capacitor and to the first terminal of the photoelectric conversion element, and wherein the transistors included in each of the pixels have the same conductivity type.

26. A device according to claim 25, wherein the transistors included in the each of the pixels arc n-channel type.

27. A device according to claim 25, wherein the transistors included in the each of the pixels are p-channel type.

28. A device according to claim 25, wherein the semiconductor device is an electric device having a hand scanner.

29. A device according to claim 25, wherein the semiconductor device is an electric device selected from the group consisting of a video camera, a digital camera, a lap-top computer, a portable information terminal, a mobile computer, a cellular phone, a portable game machine, and an electronic book.

30. A semiconductor device having a plurality of pixels, each of the pixels comprising;
a plurality of transistors;
a photoelectric conversion element having first and second terminals;
power source supply means;
a bootstrap circuit;
a light emitting element;
a discharge signal line; and
a reset signal line,
wherein the bootstrap circuit comprises:
a discharge transistor, and a boot transistor, each having a gate electrode, a source region, and a drain region; and
a capacitor having first and second terminals;
wherein the gate electrode of the discharge transistor is connected to the discharge signal line;
wherein one of the source region and the drain region of the discharge transistor is connected to the first terminal of the photoelectric conversion element, and the other is grounded;
wherein the gate electrode of the boot transistor is connected to the power source supply means;
wherein one of the source region and the drain region of the boot transistor is connected to the reset signal line, and the other is connected to the gate electrode of the reset transistor and to the first terminal of the capacitor;
wherein the gate electrode of the reset transistor is connected to the first terminal of the capacitor;
wherein one of the source region and the drain region of the reset transistor is connected to the power source supply means, and the other is connected to the second terminal of the capacitor and to the first terminal of the photoelectric conversion element;
wherein light emitted from the light emitting element is irradiated onto a subject and light reflected by the subject is irradiated onto the photoelectric conversion element; and
wherein the transistors included in each of the pixels have the same conductivity type.

31. A device according to claim 30, wherein the transistors included in the each of the pixels are n-channel type.

32. A device according to claim 30, wherein the transistors included in the each of the pixels are n-channel type.

33. A device according to claim 30, wherein the semiconductor device is an electric device having a hand scanner.

34. A device according to claim 30, wherein the semiconductor device is an electric, device selected from the group consisting of a video camera, a digital camera, a lap-top computer, a portable information terminal, a mobile computer, a cellular phone, a portable game machine, and an electronic book.

35. A semiconductor device having a pixel region, the pixel region comprising a plurality of pixels and each of the pixels comprising:
a switching element comprising a switching transistor;
an amplification element comprising an amplification transistor;
a reset element comprising a reset transistor;
a bootstrap circuit comprising;
a discharge transistor electrically connected to a gate electrode of the amplification transistor;
a boot transistor electrically connected to a gate electrode of the reset transistor; and
a capacitor electrically connected to the gate electrode of the amplification transistor and the sate electrode of the reset transistor; and
a photoelectric conversion circuit,
wherein the switching transistor, the amplification transistor, the reset transistor, the discharge transistor, and the boot transistor have the same conductivity.

36. A device according to claim 35, wherein the transistors included in the each of the pixels are n-channel type.

37. A device according to claim 35, wherein the transistors included in the each of the pixels are p-channel type.

38. A device according to claim 35, wherein the each of the pixels further comprises; a source signal line; a gate signal line; power source lines; a power source reference line; a discharge signal line; and a reset signal line, a power source reference line.

39. A device according to claim 35, wherein the each of the pixels further comprises a light emitting element portion.

40. A device according to claim 35, wherein the semiconductor device is an electric device having a hand scanner.

41. A device according to claim 35, wherein the semiconductor device is an electric device selected from the group consisting of a video camera, a digital camera, a lap-top computer, a portable information terminal, a mobile computer, a cellular phone, a portable game machine, and an electronic book.

* * * * *